(12) United States Patent
Harrold et al.

(10) Patent No.: US 11,629,847 B2
(45) Date of Patent: Apr. 18, 2023

(54) ILLUMINATION APPARATUS

(71) Applicant: Optovate Limited, Hemel Hempstead (GB)

(72) Inventors: Jonathan Harrold, Leamington Spa (GB); Graham J. Woodgate, Henley-on-Thames (GB)

(73) Assignee: Optovate Limited, Hemel Hempstead (GB)

( * ) Notice: Subject to any disclaimer, the term of this patent is extended or adjusted under 35 U.S.C. 154(b) by 83 days.

(21) Appl. No.: 17/392,632

(22) Filed: Aug. 3, 2021

(65) Prior Publication Data

US 2022/0026047 A1 Jan. 27, 2022

Related U.S. Application Data

(63) Continuation of application No. 16/937,163, filed on Jul. 23, 2020, now Pat. No. 11,287,109, which is a
(Continued)

(30) Foreign Application Priority Data

Oct. 21, 2010 (GB) ..................................... 1017771
May 17, 2011 (GB) ..................................... 1108257

(51) Int. Cl.
*F21Y 115/10* (2016.01)
*F21Y 101/00* (2016.01)
(Continued)

(52) U.S. Cl.
CPC ................ *F21V 13/04* (2013.01); *F21K 9/00* (2013.01); *F21K 9/64* (2016.08); *F21K 9/68* (2016.08);
(Continued)

(58) Field of Classification Search
CPC ........... H01L 2224/95085; H01L 33/58; H01L 2221/68322; H01L 2221/68318;
(Continued)

(56) References Cited

U.S. PATENT DOCUMENTS 5,184,114 A   2/1993   Brown
5,812,105 A   9/1998   Ven
(Continued)

FOREIGN PATENT DOCUMENTS

CN   102859268 A   1/2013
CN   103117348 A   5/2013
(Continued)

OTHER PUBLICATIONS

CN201980030275.0 Notification of the First Office Action dated Mar. 4, 2022.
(Continued)

*Primary Examiner* — Alia Sabur
(74) *Attorney, Agent, or Firm* — Penny L. Lowry

(57) ABSTRACT

An illumination apparatus comprises a plurality of LEDs aligned to an array of directional optical elements wherein the LEDs are substantially at the input aperture of respective optical elements. An electrode array is formed on the array of optical elements to provide at least a first electrical connection to the array of LED elements. Advantageously such an arrangement provides low cost and high efficiency from the directional LED array.

20 Claims, 18 Drawing Sheets

Related U.S. Application Data continuation of application No. 16/541,590, filed on Aug. 15, 2019, now abandoned, which is a continuation of application No. 16/400,223, filed on May 1, 2019, now Pat. No. 10,533,730, which is a continuation of application No. 15/382,084, filed on Dec. 16, 2016, now Pat. No. 10,330,283, which is a continuation of application No. 13/880,455, filed as application No. PCT/GB2011/001512 on Oct. 20, 2011, now Pat. No. 9,557,034.

(51) Int. Cl.

| | | |
|---|---|---|
| *G02F 1/1335* | (2006.01) | |
| *F21V 17/00* | (2006.01) | |
| *F21Y 113/13* | (2016.01) | |
| *F21K 9/69* | (2016.01) | |
| *F21K 9/90* | (2016.01) | |
| *H01L 21/66* | (2006.01) | |
| *F21V 13/04* | (2006.01) | |
| *F21K 9/00* | (2016.01) | |
| *H01L 25/075* | (2006.01) | |
| *H01L 33/60* | (2010.01) | |
| *H01L 33/62* | (2010.01) | |
| *H01L 23/00* | (2006.01) | |
| *G02B 19/00* | (2006.01) | |
| *G02F 1/13357* | (2006.01) | |
| *H01L 33/58* | (2010.01) | |
| *H01L 33/00* | (2010.01) | |
| *H01L 33/56* | (2010.01) | |
| *H01L 33/50* | (2010.01) | |
| *F21V 9/30* | (2018.01) | |
| *F21V 5/00* | (2018.01) | |
| *H01L 25/16* | (2023.01) | |
| *H01L 33/08* | (2010.01) | |
| *G09G 3/20* | (2006.01) | |
| *H01L 21/268* | (2006.01) | |
| *F21K 9/64* | (2016.01) | |
| *F21K 9/68* | (2016.01) | |

(52) U.S. Cl.
CPC ............ *F21K 9/69* (2016.08); *F21K 9/90* (2013.01); *F21V 5/007* (2013.01); *F21V 9/30* (2018.02); *G02B 19/0028* (2013.01); *G02B 19/0066* (2013.01); *G02F 1/133603* (2013.01); *G02F 1/133605* (2013.01); *G09G 3/2088* (2013.01); *H01L 21/268* (2013.01); *H01L 22/20* (2013.01); *H01L 24/32* (2013.01); *H01L 25/0753* (2013.01); *H01L 25/167* (2013.01); *H01L 33/0093* (2020.05); *H01L 33/0095* (2013.01); *H01L 33/08* (2013.01); *H01L 33/504* (2013.01); *H01L 33/507* (2013.01); *H01L 33/56* (2013.01); *H01L 33/58* (2013.01); *H01L 33/60* (2013.01); *H01L 33/62* (2013.01); *F21V 17/00* (2013.01); *F21Y 2101/00* (2013.01); *F21Y 2113/13* (2016.08); *F21Y 2115/10* (2016.08); *G02F 1/133607* (2021.01); *G02F 1/133612* (2021.01); *H01L 2224/16225* (2013.01); *H01L 2224/73265* (2013.01); *H01L 2924/01322* (2013.01); *H01L 2924/09701* (2013.01); *H01L 2924/12035* (2013.01); *H01L 2924/12042* (2013.01); *H01L 2924/1301* (2013.01); *H01L 2924/13033* (2013.01); *H01L 2924/14* (2013.01); *H01L 2924/15787* (2013.01); *H01L 2924/15788* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01); *Y10T 29/49117* (2015.01)

(58) Field of Classification Search
CPC ......... H01L 21/78–786; H01L 21/6835; H01L 2924/19105; H01L 27/3255; H01L 33/08; H01L 25/167; G09G 3/2088
See application file for complete search history.

(56) References Cited

U.S. PATENT DOCUMENTS

| | | |
|---|---|---|
| 6,547,423 B2 | 4/2003 | Marshall et al. |
| 6,570,324 B1 | 5/2003 | Tutt et al. |
| 7,014,964 B1 | 3/2006 | Hsu et al. |
| 7,084,435 B2 | 8/2006 | Sugimoto et al. |
| 7,171,874 B1 | 2/2007 | Huang |
| 7,863,614 B2 | 1/2011 | Toyama et al. |
| 7,994,531 B2 | 8/2011 | Lin et al. |
| 8,721,115 B2 | 5/2014 | Ing et al. |
| 8,794,792 B1 | 8/2014 | Moghal et al. |
| 9,519,153 B2 | 12/2016 | Robinson et al. |
| 10,121,772 B1 | 11/2018 | Wu et al. |
| 10,126,575 B1 | 11/2018 | Robinson et al. |
| 10,303,030 B2 | 5/2019 | Robinson et al. |
| 10,533,730 B2 | 1/2020 | Harrold et al. |
| 11,063,193 B2 | 7/2021 | Woodgate et al. |
| 2004/0080938 A1 | 4/2004 | Holman et al. |
| 2004/0089935 A1 | 5/2004 | Lehner |
| 2004/0126911 A1 | 7/2004 | Kimura |
| 2004/0161871 A1 | 8/2004 | Omori |
| 2004/0218390 A1 | 11/2004 | Holman et al. |
| 2004/0239243 A1 | 12/2004 | Roberts et al. |
| 2004/0263061 A1 | 12/2004 | Ishikawa et al. |
| 2005/0111100 A1 | 5/2005 | Mather et al. |
| 2005/0219693 A1 | 10/2005 | Hartkop et al. |
| 2006/0152931 A1 | 7/2006 | Holman |
| 2006/0221611 A1 | 10/2006 | Noh et al. |
| 2006/0256255 A1 | 11/2006 | Minami |
| 2006/0290276 A1 | 12/2006 | Cok et al. |
| 2007/0007237 A1 | 1/2007 | Wu et al. |
| 2007/0019131 A1 | 1/2007 | Choi et al. |
| 2007/0047254 A1 | 3/2007 | Schardt et al. |
| 2007/0116424 A1 | 5/2007 | Ting et al. |
| 2007/0165394 A1 | 7/2007 | Chang |
| 2007/0176195 A1 | 8/2007 | Kuiseko et al. |
| 2007/0236628 A1 | 10/2007 | Epstein |
| 2007/0242477 A1 | 10/2007 | Yoo et al. |
| 2007/0256453 A1 | 11/2007 | Barnes et al. |
| 2008/0043466 A1 | 2/2008 | Chakmakjian et al. |
| 2008/0089093 A1 | 4/2008 | Miller et al. |
| 2008/0123350 A1 | 5/2008 | Choe et al. |
| 2008/0225523 A1 | 9/2008 | Samber et al. |
| 2008/0237612 A1 | 10/2008 | Cok |
| 2008/0258162 A1 | 10/2008 | Koung et al. |
| 2008/0285310 A1 | 11/2008 | Aylward et al. |
| 2008/0315755 A1 | 12/2008 | Han |
| 2009/0001869 A1 | 1/2009 | Tanimoto et al. |
| 2009/0073350 A1 | 3/2009 | Toyama et al. |
| 2009/0086508 A1 | 4/2009 | Bierhuizen |
| 2009/0109656 A1 | 4/2009 | Chang |
| 2009/0128735 A1 | 5/2009 | Larson et al. |
| 2009/0242929 A1 | 10/2009 | Lin |
| 2009/0268428 A1 | 10/2009 | Tsukada |
| 2009/0296389 A1 | 12/2009 | Hsu |
| 2010/0061096 A1 | 3/2010 | Sato |
| 2010/0097809 A1 | 4/2010 | Munro et al. |
| 2010/0165635 A1 | 7/2010 | Chen et al. |
| 2010/0171215 A1 | 7/2010 | Fischer et al. |
| 2010/0172152 A1 | 7/2010 | Boonekamp |
| 2010/0195330 A1 | 8/2010 | Schaefer et al. |
| 2010/0207852 A1* | 8/2010 | Cok ............... H01L 27/3213 345/83 |
| 2010/0258543 A1* | 10/2010 | Mizuno ............ H01L 24/95 219/121.72 |
| 2010/0295762 A1 | 11/2010 | Yeom et al. |

(56) References Cited

U.S. PATENT DOCUMENTS

| | | | |
|---|---|---|---|
| 2010/0317132 A1* | 12/2010 | Rogers | H01L 21/6835 257/E33.059 |
| 2011/0003410 A1* | 1/2011 | Tsay | H01L 33/0093 977/932 |
| 2011/0018860 A1 | 1/2011 | Parry-Jones et al. | |
| 2011/0038150 A1 | 2/2011 | Woodgate et al. | |
| 2011/0090672 A1 | 4/2011 | Zhu et al. | |
| 2011/0151602 A1 | 6/2011 | Speier | |
| 2011/0194034 A1 | 8/2011 | Shimizu | |
| 2011/0255303 A1 | 10/2011 | Nichol et al. | |
| 2012/0086875 A1 | 4/2012 | Yokota | |
| 2012/0119237 A1 | 5/2012 | Leatherdale et al. | |
| 2012/0140462 A1 | 6/2012 | Pickard | |
| 2012/0147296 A1 | 6/2012 | Montgomery et al. | |
| 2012/0258963 A1 | 10/2012 | Berger et al. | |
| 2012/0320627 A1 | 12/2012 | Araki et al. | |
| 2013/0033849 A1 | 2/2013 | Roberts et al. | |
| 2013/0039062 A1 | 2/2013 | Vinther et al. | |
| 2013/0107525 A1 | 5/2013 | Woodgate et al. | |
| 2013/0121000 A1 | 5/2013 | Lee et al. | |
| 2013/0194812 A1 | 8/2013 | Tseng | |
| 2013/0235580 A1 | 9/2013 | Smith | |
| 2013/0258663 A1 | 10/2013 | Woodgate et al. | |
| 2013/0293793 A1 | 11/2013 | Lu | |
| 2014/0022619 A1 | 1/2014 | Woodgate et al. | |
| 2014/0098418 A1 | 4/2014 | Lin | |
| 2014/0140654 A1 | 5/2014 | Brown et al. | |
| 2014/0186979 A1 | 7/2014 | Tu et al. | |
| 2014/0211462 A1 | 7/2014 | Keller et al. | |
| 2014/0211503 A1 | 7/2014 | Tarsa | |
| 2014/0240828 A1 | 8/2014 | Robinson et al. | |
| 2014/0240839 A1 | 8/2014 | Yang et al. | |
| 2014/0299897 A1 | 10/2014 | Zhang et al. | |
| 2014/0316742 A1 | 10/2014 | Sun et al. | |
| 2015/0054011 A1 | 2/2015 | Koizumi et al. | |
| 2015/0062490 A1 | 3/2015 | Kwon | |
| 2015/0160396 A1 | 6/2015 | Wilcox et al. | |
| 2015/0268479 A1 | 9/2015 | Woodgate et al. | |
| 2015/0268513 A1 | 9/2015 | Chang et al. | |
| 2015/0295154 A1 | 10/2015 | Tu et al. | |
| 2015/0308635 A1 | 10/2015 | Li et al. | |
| 2016/0018077 A1 | 1/2016 | Mallory et al. | |
| 2016/0211413 A1 | 7/2016 | Park et al. | |
| 2016/0299281 A1 | 10/2016 | Robinson et al. | |
| 2017/0031085 A1 | 2/2017 | Lim et al. | |
| 2017/0045666 A1 | 2/2017 | Vasylyev | |
| 2017/0059127 A1 | 3/2017 | Jansma et al. | |
| 2017/0102127 A1 | 4/2017 | Woodgate et al. | |
| 2017/0139114 A1 | 5/2017 | Woodgate et al. | |
| 2017/0154919 A1 | 6/2017 | Chen et al. | |
| 2017/0161179 A1 | 6/2017 | Maple et al. | |
| 2017/0205959 A1 | 7/2017 | Seong | |
| 2017/0219883 A1 | 8/2017 | Yin | |
| 2017/0248289 A1 | 8/2017 | Vasylyev | |
| 2017/0261179 A1 | 9/2017 | Wu et al. | |
| 2018/0014007 A1 | 1/2018 | Brown | |
| 2018/0135831 A1 | 5/2018 | Smith et al. | |
| 2018/0226384 A1 | 8/2018 | Park et al. | |
| 2018/0321553 A1 | 11/2018 | Robinson et al. | |
| 2019/0086706 A1 | 3/2019 | Robinson et al. | |
| 2019/0139243 A1 | 5/2019 | You et al. | |
| 2019/0215509 A1 | 7/2019 | Woodgate et al. | |
| 2019/0220121 A1 | 7/2019 | Kim et al. | |
| 2019/0250458 A1 | 8/2019 | Robinson et al. | |
| 2019/0265478 A1 | 8/2019 | Cok et al. | |
| 2019/0278135 A1 | 9/2019 | Woodgate et al. | |
| 2019/0294004 A1 | 9/2019 | Hashimoto | |
| 2019/0377067 A1 | 12/2019 | Han et al. | |
| 2020/0049876 A1 | 2/2020 | Watanabe et al. | |
| 2020/0096171 A1 | 3/2020 | Han et al. | |
| 2020/0124834 A1 | 4/2020 | Woodgate et al. | |
| 2020/0127169 A1 | 4/2020 | Ahmed | |
| 2020/0159055 A1 | 5/2020 | Robinson et al. | |
| 2020/0166783 A1 | 5/2020 | Roy et al. | |
| 2020/0259307 A1 | 8/2020 | Sharma et al. | |
| 2020/0321553 A1 | 10/2020 | Kwon et al. | |
| 2020/0355896 A1 | 11/2020 | Woodgate et al. | |

FOREIGN PATENT DOCUMENTS

| | | |
|---|---|---|
| CN | 105556374 A | 5/2016 |
| CN | 105849595 A | 8/2016 |
| CN | 107402475 A | 11/2017 |
| DE | 102010031945 A1 | 1/2012 |
| EP | 1387412 A1 | 2/2004 |
| EP | 1835550 A2 | 9/2007 |
| EP | 1890343 A1 | 2/2008 |
| EP | 1986023 A1 | 10/2008 |
| EP | 2182783 A2 | 5/2010 |
| EP | 2595295 A1 | 5/2013 |
| GB | 2464102 A | 4/2010 |
| GB | 2484711 A | 4/2012 |
| JP | 2000323755 A | 11/2000 |
| JP | 2007294411 A | 11/2007 |
| JP | 2009295309 A | 12/2009 |
| JP | 2010238846 A | 10/2010 |
| JP | 2013219397 A | 10/2013 |
| WO | 2006115313 A1 | 11/2006 |
| WO | 2007074932 A1 | 7/2007 |
| WO | 2008109296 A1 | 9/2008 |
| WO | 2010038025 A2 | 4/2010 |
| WO | 2010038025 A3 | 6/2010 |
| WO | 2011131200 A1 | 10/2011 |
| WO | 2012052722 A2 | 4/2012 |
| WO | 2012052723 A1 | 4/2012 |
| WO | 2013064801 A1 | 5/2013 |
| WO | 2013112435 A1 | 8/2013 |
| WO | 2014043384 A1 | 3/2014 |
| WO | 2015089517 A1 | 6/2015 |
| WO | 2017007770 A2 | 1/2017 |
| WO | 2018185475 A1 | 10/2018 |
| WO | 2018185476 A1 | 10/2018 |
| WO | 2018208618 A1 | 11/2018 |
| WO | 2019067846 A1 | 4/2019 |
| WO | 2019107826 A1 | 6/2019 |

OTHER PUBLICATIONS

PCT/US2022/034145 International search report and written opinion of the international searching authority dated Oct. 6, 2022.
CN201880036805.8 Notification of the First Office Action dated Jul. 23, 2021.
CN201880036842.9 Notification of the First Office Action dated Jul. 23, 2021.
EP18200530.6—European Search Report of the European Patent Office dated May 23, 2019.
International search report and written opinion of international searching authority for PCT application PCT/GB2018/050893 dated Aug. 27, 2018.
International search report and written opinion of international searching authority for PCT application PCT/GB2018/050894 dated Aug. 27, 2018.
International search report and written opinion of international searching authority for PCT application PCT/GB2019/050076 dated May 9, 2019.
International search report and written opinion of international searching authority for PCT application PCT/US2019/021570 dated May 24, 2019.
International search report and written opinion of international searching authority for PCT application PCT/US2019/031526 dated Jul. 29, 2019.
International search report and written opinion of international searching authority for PCT application PCT/US2020/040686 dated Nov. 20, 2020.
International search report and written opinion of international searching authority for PCT application PCT/US2020/047383 dated Dec. 4, 2020.
International search report and written opinion of international searching authority for PCT application PCT/US2020/050460 dated Dec. 8, 2020.

(56) References Cited

OTHER PUBLICATIONS

International search report and written opinion of international searching authority for PCT application PCT/US2020/050527 dated Feb. 3, 2021.
International search report and written opinion of international searching authority for PCT application PCT/US2020/053825 dated Dec. 30, 2020.
International search report and written opinion of international searching authority for PCT application PCT/US2020/053864 dated Dec. 14, 2020.
CN201980016364.X Notification of the First Office Action dated Dec. 27, 2021.
EP19804311.9—Extended European Search Report of the European Patent Office dated Dec. 15, 2021.

* cited by examiner

ILLUMINATION APPARATUS

TECHNICAL FIELD

The technical field relates to an illumination apparatus; an optical element for an illumination apparatus and a method to manufacture an illumination apparatus. Such an apparatus may be used for domestic or professional lighting, for display illumination and for general illumination purposes.

BACKGROUND

Light-emitting diodes (LEDs) formed using semiconductor growth on monolithic wafers can demonstrate significantly higher levels of efficiency compared to incandescent sources. In this specification LED refers to an unpackaged LED die (chip) extracted from a monolithic wafer, i.e. a semiconductor element. This is different from packaged LEDs which have been assembled into a package to facilitate subsequent assembly and may further incorporate optical elements such as a hemisphere which increases its size and light extraction efficiency.

In lighting applications, the light from the emitter is directed using a luminaire optical structure to provide the output directional profile. The angular intensity variation is termed the directional distribution which in turn produces a light radiation pattern on surfaces in the illuminated environment. Lambertian emitters flood an illuminated environment with light. Non-Lambertian, directional light sources use a relatively small source size lamp such as a tungsten halogen type in a reflector and/or reflective tube luminaire, in order to provide a more directed source. Such lamps efficiently use the light by directing it to areas of importance. These lamps also produce higher levels of visual sparkle, in which the small source provides specular reflection artefacts, giving a more attractive illumination environment. Further, such lights have low glare, in which the off-axis intensity is substantially lower than the on-axis intensity so that the lamp does not appear uncomfortably bright when viewed from most positions.

Directional LED elements can use reflective optics (including total internal reflective optics) or more typically catadioptric type reflectors, as described for example in U.S. Pat. No. 6,547,423. Catadioptric elements employ both refraction and reflection, which may be total internal reflection (TIR) or reflection from metallised surfaces. A known catadioptric optic system is capable of producing a 6 degree cone half angle (to 50% peak intensity) from a macroscopic LED comprising a 1×1 mm light emitting element, with an optical element with 20 mm final output diameter. The increase in source size arises from conservation of brightness (étendue) reasons. Further, such an optical element will have a thickness of approximately 10 mm, providing a bulky illumination apparatus. Increasing the cone angle will reduce the final device area and thickness, but also produces a less directional source.

The LED of this example may be replaced by a 10×10 array of LEDs each for example 0.1×0.1 mm size, providing the same emitting area. This arrangement has a number of performance advantages, including reduced junction temperature (reducing illumination apparatus cost), reduced optical element thickness (reducing illumination apparatus cost), reduced current crowding (increasing device efficiency or reducing cost for a given output luminance) and higher current density capability (increasing device luminance or reducing cost for a given output luminance). It is therefore desirable to reduce the LED size.

It is desirable to reduce the number of electrical connection steps in connection of such an array of LEDs, to reduce cost. It is further desirable to reduce the area of electrical connection to such LEDs, preferably at least in proportion to the reduction of area of the LED to maximise emitting area of the chip. It is further desirable to provide electrical connections to LEDs on opposite surfaces to reduce current crowding.

PCT/GB2009/002340 describes a method to form an illumination apparatus with an array of small LEDs by preserving the separation of the LED elements from the monolithic wafer in a sparse array and aligning to an array of optical elements. GB2463954 shows one electrical connection method to LEDs of an LED array, in which the optical input aperture is positioned between the electrical connections and output aperture of the optical elements of the array of optical elements.

EP1 890 343 describes LEDs positioned in reflective cups with an overcoating transparent layer. Such devices are not suitable for providing directional illumination with narrow cone angles.

In addition, other objects, desirable features and characteristics will become apparent from the subsequent summary and detailed description, and the appended claims, taken in conjunction with the accompanying drawings and this background.

SUMMARY

According to an aspect of the present disclosure there is provided an illumination apparatus whose primary purpose is illumination as opposed to display, comprising: an optical element array structure; and a light emitting element structure; the optical element array structure and the light emitting element structure having been provided as respective separate structures before being assembled together; the optical element array structure comprising a plurality of optical elements, wherein the optical elements are catadioptric, reflective or refractive, and the optical elements are arranged in an array; the light emitting element structure comprising a substrate and a plurality of light emitting elements arranged on the substrate; the optical element array structure and the light emitting element structure being arranged such that the optical elements of the optical element array structure are aligned with the light emitting elements of the light emitting element structure; and wherein the optical element array structure further comprises electrodes, hereinafter referred to as optical element electrodes, arranged thereon for providing electrical connection to the plurality of light emitting elements. The optical element electrodes may be, at least in part, positioned on a part of the optical elements that has a shape profile or a material composition profile of the optical element that is related to the catadioptric, reflective or refractive characteristic of the optical element. For at least some of the plurality of light emitting elements a first electrical connection to the light emitting element may be provided by a first optical element electrode and a second electrical connection to the light emitting element may be provided by a second optical element electrode. For at least some of the plurality of light emitting elements a first electrical connection to the light emitting element may be provided by the optical element electrode and a second electrical connection to the light emitting element may be provided by a support substrate electrode. At least one optical element electrode may be formed on a substantially planar surface formed between at least two optical elements of the optical element array structure. The optical element electrodes may be, at least in part, positioned on a part of the optical elements that has a shape profile substantially arranged to provide a contact between the optical element electrodes and substrate electrodes. The part of the optical elements may comprise a transparent polymer material composition. The optical elements may comprise a wavelength conversion material. At least one of the substrate or optical array may further comprise electronic components arranged in the region between light emitting elements of the light emitting element array. The plurality of light emitting elements may cooperate to provide at least one light emitting element string comprising at least two light emitting elements connected in series and the at least one current source may be multiplexed to multiple strings of light emitting elements.

According to an aspect of the present disclosure there is provided a method of manufacturing an illumination apparatus whose primary purpose is illumination as opposed to display, the method comprising: providing an optical element array structure; and providing a light emitting element structure; wherein the optical element array structure and the light emitting element structure are provided as respective separate structures; the optical element array structure comprising a plurality of optical elements, wherein the optical elements are catadioptric, reflective or refractive, and the optical elements are arranged in an array; the optical element array structure further comprising electrodes, hereinafter referred to as optical element electrodes, arranged thereon for providing electrical connection to the plurality of light emitting elements; the light emitting element structure comprising a substrate and a plurality of light emitting elements arranged on the substrate; and assembling the optical element array structure with the light emitting element structure such that the optical elements of the optical element array structure are aligned with the light emitting elements of the light emitting element structure.

According to an aspect of the present disclosure there is provided an optical element array structure, comprising: a plurality of optical elements, wherein the optical elements are catadioptric, reflective or refractive, and the optical elements are arranged in an array; the optical element array structure being for being assembled with a light emitting element structure comprising a substrate and a plurality of light emitting elements arranged on the substrate such that the optical elements of the optical element array structure are aligned with the light emitting elements of the light emitting element structure; and wherein the optical element array structure further comprises electrodes arranged thereon for providing electrical connection to the plurality of light emitting elements when the optical element array structure and the light emitting element structure are assembled.

According to an aspect of the present disclosure there is provided an array of optical elements; the optical elements are catadioptric directional optical elements; the array of optical elements being adapted to be aligned with a plurality of light emitting elements arranged in an array to provide an illumination apparatus;

wherein: the array of optical elements comprises first electrodes, hereinafter referred to as optical element electrodes, thereon arranged for providing a first electrical connection to the plurality of light emitting elements.

The array of optical elements may be adapted to be aligned with the plurality of light emitting elements to provide a light output cone from the illumination apparatus with an output cone angle of less than 30 degrees.

According to an aspect of the present disclosure there is provided an array of catadioptric optical elements; the array of catadioptric optical elements being adapted to be aligned with a plurality of light emitting elements arranged in an array with each light emitting element positioned substantially at an input surface of a respective catadioptric optical element, to provide an illumination apparatus, wherein the catadioptric optical elements each comprise: a first section comprising a polymer material with a first refractive index; and a second section comprising a polymer material with a second refractive index greater than the first refractive index; wherein the refractive part of the catadioptric optical characteristic of each catadioptric optical element is provided by a respective interface between its first section and its second section, and the respective input surface of each optical element comprises the input surface of its first section. The reflective part of the catadioptric optical characteristic of each catadioptric optical element may be provided by a reflective surface comprised by its second section. The catadioptric optical elements may each comprise: the first section is bounded by an input surface being adapted to be substantially positioned at the light emitting elements, a wall surface and a lens surface; the second section is bounded substantially by the wall surface and the lens surface of the first section and further bounded by a reflecting surface and an output surface; such that the first and second sections are capable of cooperating to direct light from the light emitting elements to an output surface. A recess in the input surface may be adapted for alignment with a respective light emitting element of the plurality of light emitting elements. A filler polymer material may be provided between the reflecting surfaces of adjacent optical elements of the array of optical elements wherein the filler polymer material has a substantially planar surface substantially in the plane of the input surface of at least one of the array of optical elements to provide a substantially uniform thickness optical element array structure. The reflective part of the catadioptric optical characteristic of each catadioptric optical element may be provided by total internal reflection in the second section.

According to an aspect of the present disclosure there is provided an illumination apparatus comprising an array of catadioptric optical elements aligned with a plurality of light emitting elements, wherein the optical elements comprise: a first section comprising a polymer material with a first refractive index; and a second section comprising a polymer material with a second refractive index greater than the first refractive index; the refractive part of the catadioptric optical characteristic of each catadioptric optical element is provided by a respective interface between its first section and its second section; and wherein each light emitting element is positioned substantially at an input surface of the first section of its respective optical element. The reflective part of the catadioptric optical characteristic of each catadioptric optical element may be provided by a reflective surface comprised by its second section.

According to an aspect of the present disclosure there is provided a method of manufacturing an illumination apparatus; the method comprising: forming a monolithic array of light-emitting elements; selectively removing a plurality of light-emitting elements from the monolithic array by adhering them to a first adhesive substrate in a manner that preserves the relative spatial position of the selectively removed light-emitting elements; transferring the plurality of light emitting elements from the first adhesive substrate to a second adhesive substrate in a manner that preserves the relative spatial position of the selectively removed light-emitting elements; transferring the plurality of light emitting elements from the second adhesive substrate to a support substrate in a manner that preserves the relative spatial position of the selectively removed light-emitting elements; wherein the plurality of light-emitting elements that are selectively removed from the monolithic array are selected such that, in at least one direction, for at least one pair of the selectively removed light-emitting elements in the at least one direction, for each respective pair there is at least one respective light-emitting element that is not selected that was positioned in the monolithic array between the pair of selectively removed light-emitting elements in the at least one direction. The adhesive force of light emitting elements to the second adhesive substrate may be greater than the adhesive force of the light emitting elements to the first adhesive substrate. The adhesive force of the light emitting elements to the support substrate may be greater than the adhesive force of the light emitting elements to the second adhesive substrate. The support substrate may comprise an array of optical elements and the array of light emitting elements may be aligned with the respective optical elements. The array of light emitting elements may be aligned with an optical substrate comprising an array of optical elements. The support substrate may comprise a planar substrate wherein the array of light emitting elements is aligned with an optical substrate comprising an optical element array structure.

According to an aspect of the present disclosure there is provided a method of manufacturing an illumination apparatus; the method comprising: forming a first monolithic array of light emitting elements; determining a first plurality of the light emitting elements which pass a functional criterion; determining a second plurality of the light emitting elements which fail the functional criterion; selectively removing a plurality of the passed light emitting elements whose relative positions in the first monolithic array correspond to desired relative positions in a desired non-monolithic array of light emitting elements, the selectively removing being performed in a manner that preserves the relative spatial position of the selectively removed passed light-emitting elements; wherein the plurality of passed light-emitting elements that are selectively removed from the monolithic array are selected such that, in at least one direction, for at least one pair of the selectively removed passed light-emitting elements in the at least one direction, for each respective pair there is at least one respective light-emitting element that is not selected that was positioned in the monolithic array between the pair of removed passed light-emitting elements in the at least one direction; and forming a non-monolithic array of light-emitting elements with the selectively removed passed light-emitting elements in a manner that preserves the relative spatial position of the selectively removed passed light-emitting elements; by virtue of which in the formed non-monolithic array of light emitting elements desired relative positions of the desired array that correspond to passed light emitting elements in the first monolithic array are occupied by passed light emitting elements and desired relative positions of the desired array that correspond to failed light emitting elements in the first monolithic array are left unoccupied. Further light emitting elements may be added to the formed non-monolithic array of light mining elements in unoccupied desired relative positions of the desired array. The further light emitting elements may be from a second monolithic array of light-emitting elements that is different to the first monolithic array of light-emitting elements. The further light emitting elements may be from the first monolithic array of light-emitting elements. The further light emitting elements may be light emitting elements which have been determined as passing the functional criterion. The method may further comprise forming a light intensity reduction region on a surface of the monolithic array support substrate aligned with the second plurality of light emitting elements.

According to an aspect of the present disclosure there is provided a method of manufacturing an illumination apparatus; the method comprising: forming a non-monolithic array of light-emitting elements on a support substrate; for at least some of the light-emitting elements in a first region of the support substrate, measuring their combined spectral output; providing a first wavelength conversion layer in alignment with the respective light emitting elements of the first region, the spectral characteristic of the first wavelength conversion layer being selected dependent upon the measured combined spectral output from the measured light emitting elements of the first region; for at least some of the light-emitting elements in a second region of the support substrate, measuring their combined spectral output; and providing a second wavelength conversion layer in alignment with the respective light emitting elements of the second region, the spectral characteristic of the second wavelength conversion layer being selected dependent upon the measured combined spectral output from the measured light emitting elements of the second region. A first region average white point may be provided by virtue of providing the first wavelength conversion layer in alignment with the respective light emitting elements of the first region; a second region average white point may be provided by virtue of providing the second wavelength conversion layer in alignment with the respective light emitting elements of the second region, and wherein the first region average white point and the second region average white point are thereby more similar than they would be if the two regions had been provided with a same wavelength conversion layer. A first region average white point may be provided by virtue of providing the first wavelength conversion layer in alignment with the respective light emitting elements of the first region, a second region average white point may be provided by virtue of providing the second wavelength conversion layer in alignment with the respective light emitting elements of the second region, and wherein the first region average white point and the second region average white point may be substantially the same. The spectral characteristics of the first wavelength conversion layer may be different to the spectral characteristics of the second wavelength conversion layer.

According to an aspect of the present disclosure there is provided a method of manufacturing an illumination apparatus; the method comprising: forming a monolithic light-emitting layer on a first substrate; transferring the monolithic light-emitting layer to an electromagnetic wavelength band transmitting substrate; selectively removing a plurality of light-emitting elements from the monolithic light-emitting layer in a manner that preserves the relative spatial position of the selectively removed light-emitting elements, performing of the selectively removing comprising selectively illuminating the monolithic array of light-emitting elements through the electromagnetic wavelength band transmitting substrate with light in the electromagnetic wavelength band; forming a non-monolithic array of light-emitting elements with the selectively removed light-emitting elements in a manner that preserves the relative spatial position of the selectively removed light-emitting elements; and aligning the non-monolithic array of light-emitting elements with an array of optical elements. The first substrate may be an electromagnetic wavelength band absorbing substrate.

According to an aspect of the present disclosure there is provided a method of manufacturing an illumination apparatus; the method comprising: forming a monolithic array of light-emitting elements made of a plurality of layers on a substrate, the light emitting elements being inter-connected in the layers they are formed in; selectively illuminating a plurality of the light emitting elements with an illumination that separates, at least to an extent, the selected light emitting elements from the substrate; the illumination further breaking the connection in the layers between each selectively illuminated light emitting element and the other light emitting elements; removing the illuminated light-emitting elements from the monolithic array in a manner that preserves the relative spatial position of the removed light-emitting elements; wherein the plurality of light-emitting elements that are selectively illuminated and removed from the monolithic array are selected such that, in at least one direction, for at least one pair of the selectively illuminated and removed light-emitting elements in the at least one direction, for each respective pair there is at least one respective light-emitting element that is not selected that was positioned in the monolithic array between the pair of selectively illuminated and removed light-emitting elements in the at least one direction. The method may further comprise providing a patterned support layer formed on the plurality of light emitting elements.

By way of comparison with a known illumination apparatus, the present embodiments advantageously provide a reduced cost electrical connection apparatus for an illumination apparatus. Advantageously the electrical connection apparatus is integrated with the optical element and substantially at the input aperture of the optical element such that light from the LED is collected efficiently. The electrical connection may provide a vertical connection path to the LED, reducing current crowding and increasing LED efficiency. The area of the electrical connection may be reduced improving light extraction efficiency. The LEDs of the array may be connected in parallel, reducing assembly time and cost and increasing device reliability. Further the optical throughput efficiency of an array of catadioptric optical elements is improved in comparison with known arrays of elements.

A person skilled in the art can gather other characteristics and advantages of the disclosure from the following description of exemplary embodiments that refers to the attached drawings, wherein the described exemplary embodiments should not be interpreted in a restrictive sense.

BRIEF DESCRIPTION OF THE DRAWINGS

Embodiments of the present disclosure will now be described, by way of example only, with reference to the accompanying drawings in which:

FIG. 43 shows a phosphor array for use with the composite substrate of FIG. 42a;

DETAILED DESCRIPTION

The following detailed description is merely exemplary in nature and is not intended to limit the present disclosure or the application and uses of the present disclosure. Furthermore, there is no intention to be bound by any theory presented in the preceding background or the following detailed description.

Figure 1:
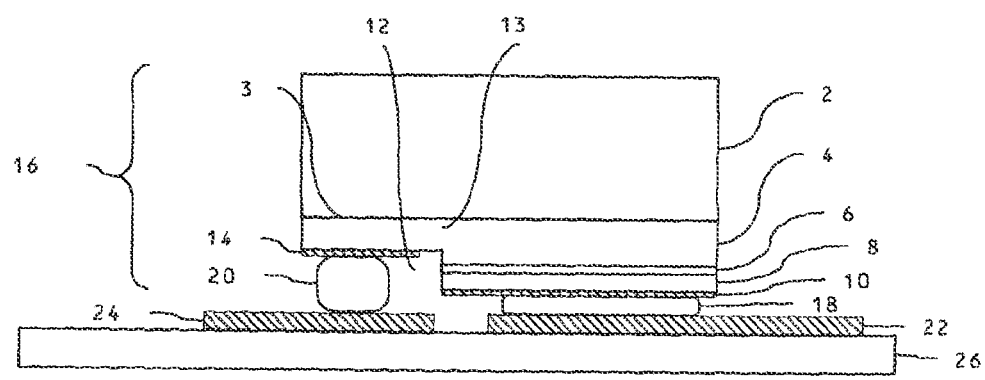
FIG. 1 shows a flip chip LED with lateral electrical connections.

A known type of flip chip LED 16 comprising one example of a light emitting element 42 with lateral configuration is shown with electrical connections in FIG. 1. A substrate 2 such as sapphire has epitaxial layers formed on its surface 3. Typically a gallium nitride device comprises an n-doped layer 4, a multiple quantum well structure 6 and a p-doped layer 8 with a p-electrode 10. In the region 12, a portion of the p-layer and structure 6 is removed to provide a contact electrode 14 to be formed in contact with the n-doped layer 4. This arrangement suffers from current crowding in the region 13, reducing the maximum light output that can be obtained from the device. Solder connections 18, 20 are formed on electrodes 22, 24 respectively, mounted on a support substrate 26.

In this specification, the term solder connections refers to known electrical connections including those formed by heating or by pressure or combination of heating and pressure applied to suitable electrically conductive materials.

Figure 2:
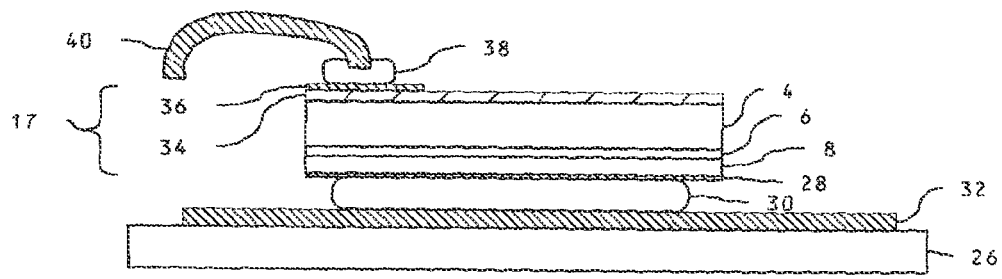
FIG. 2 shows a vertical thin film LED.

FIG. 2 shows a vertical thin film (VTF) configuration LED 17 comprising another example of a light emitting element 42 in which the n-doped layer 4 has been separated from the substrate 2, for example by means of laser lift off. An electrode 28 is applied to the p-doped layer 8 and attached by means of a solder element 30 to an electrode 32 formed on the substrate 26. The n-doped layer may optionally have a transparent electrode 34 formed on its surface, and a further electrode 36 to provide a solder 38 contact to an input electrode 40. Such a VTF configuration advantageously has reduced current crowding compared to the arrangement of FIG. 1.

However, the VTF configuration needs an electrode connection on the top surface, and so often requires a wire bonding process. In the case of large arrays of small light emitting elements, this would require a large number of time consuming wire bonds to be formed. Further, wire bonding technology may have limited positional accuracy so that a large non-emitting bond pad area on electrode 36 is required to provide reliable wire bonding. For example, the wire bond pad size may be 100 micrometers in size, which tray be comparable to the desirable size of the LED light emitting element 42. However, microscopic LEDs similar to those manufactured using the method of PCT/GB2009/002340 achieve small bond pad size due to the use of photolithographically defined electrodes on large accurate arrays of small light emitting elements.

Figure 3A:
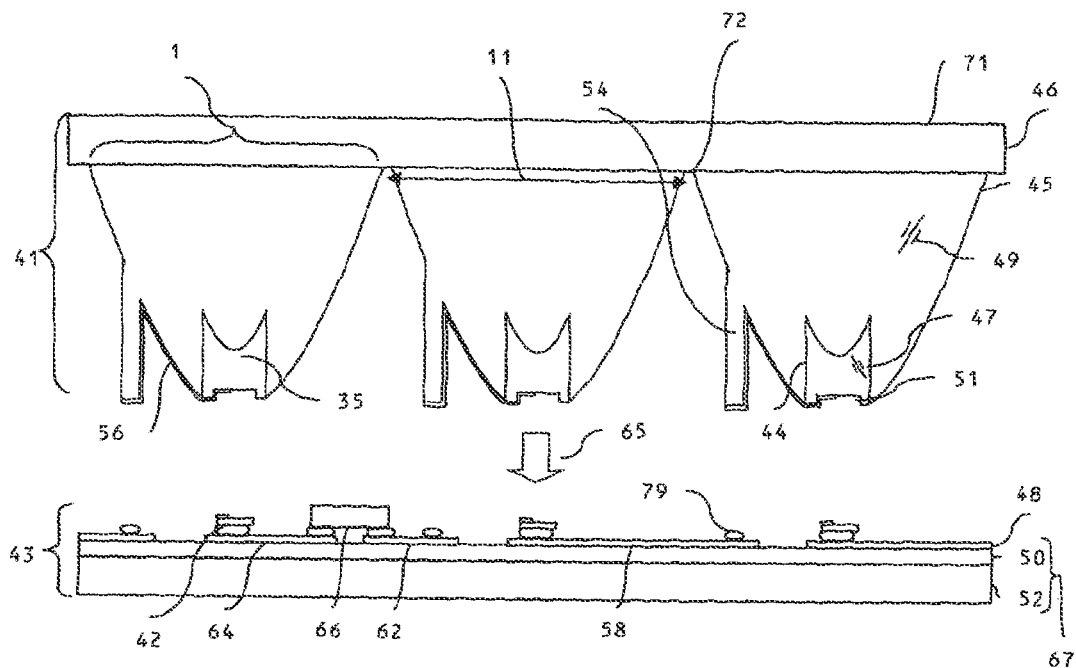
FIG. 3a shows the respective separate structures of an optical element array structure and light emitting element structure before being assembled together.

FIG. 3a shows an embodiment wherein a directional illumination apparatus prior to assembly comprises a light emitting element structure 43 comprising a substrate 67 and an array of light emitting elements 42 comprising VTF LEDs 17 arranged on the substrate 67; and an optical element array structure 41 comprising a plurality of optical elements 1.

Figure 3B:
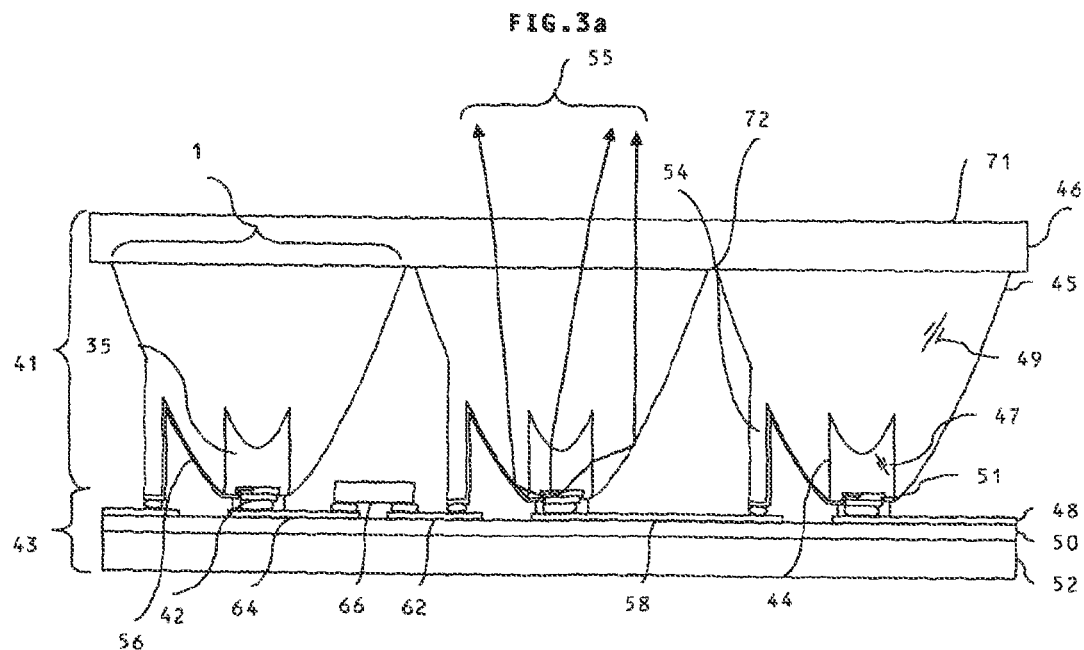
FIG. 3b shows an illumination apparatus comprising the respective structures of FIG. 3a after being assembled together.

After assembly by aligning the structures 41, 43, and translating in direction 65 such that the optical elements 1 of the optical element array structure 41 are aligned with the light emitting element 42 of the light emitting element structure 43, an illumination apparatus as shown in FIG. 3b is formed. The optical element structure 41 further comprises optical element electrodes 56 arranged thereon for providing electrical connection to the plurality of light emitting elements 42. Further, electrical connection joints 79 are provided to facilitate connection between the two respective substrates. Joints 79 may be provided by solder (that may be eutectic solder), conductive adhesive or other known electrical connection material systems and may be arranged on one or both of the structures 41, 43. The light emitting elements 42 are further electrically connected by means of optical element electrode 56 and substrate electrode 64. Optical element electrode 56 thus provides a first electrical connection to the light emitting element 42. A connecting structure 54 is formed in or attached to the optical element 1 on which the optical element electrode 56 is formed. This provides a contact between the optical element electrode 56 and the substrate electrode 62 or substrate electrode 58. The substrate electrode 64 provides a second electrical connection to the light emitting element 42. Thus for at least some of the plurality of light emitting elements 42 a first electrical connection to the light emitting element is provided by the optical element electrode 56 and a second electrical connection to the light emitting element is provided by a support substrate electrode 58, 62 or 64.

The light emitting elements 42 can be operated as one or more strings of light emitting elements 42 by connecting the n-doped layer of one light emitting element 42 to the p-doped layer of an adjacent light emitting element 42. The optical element array structure 41 and light emitting element structure 43 thus cooperate to provide at least one light emitting element string comprising at least two light emitting elements 42 connected in series. Active or passive electronic control elements 66, for example transistors, rectifying diodes or resistors may be positioned between substrate electrodes 62 and 64, providing some electrical control of light emitting elements 42 within the array and between adjacent optical elements. The elements 66 may form an electrical circuit with light emitting elements 42 including being in series or parallel with at least some of them. The optical element electrodes 56 are, at least in part, positioned on a part (connecting structure 54) of the optical elements 1 that has a shape profile substantially arranged to provide a contact between the optical element electrodes 56 and substrate electrodes 58, 62. The part (connecting structure 54) may comprise a transparent polymer material composition.

The light emitting elements 42 and substrate electrodes 58, 62, 64 may be formed at least in part on a substrate 67 that may comprise an electrically insulating layer 50 and a heat conducting layer 52 which provide a heat sink function and may for example be a metal core printed circuit board. Alternatively, the layer 50 may have sufficient rigidity that it can comprise the substrate 67 without additional layer 52 during processing of the light emitting elements 42. Substrate 67 may be typically planar and may be in the form of a mothersheet support substrate with large area to achieve the processing of many light emitting elements in parallel, reducing cost. The substrate 67 or the optical element array structure 41 may comprise electronic components 66 arranged in the region between light emitting elements 42 of the light emitting element array. The electronic components may provide additional functions to the array of light emitting elements 42 and may be non light-emitting.

Thus the embodiment comprises an array of optical elements 1 in which the optical elements 1 are catadioptric. Alternatively, the optical elements 1 may be reflective or refractive. The array of optical elements 1 are adapted to be aligned with a plurality of light emitting elements 42 (for example LEDs 16 or LEDs 17) arranged in an array to provide an illumination apparatus wherein the array of optical elements 1 comprises electrodes thereon arranged for providing electrical connection to the plurality of light emitting elements 42.

Thus an illumination apparatus whose primary purpose is illumination as opposed to display, may comprise an optical element array structure 41; and a light emitting element structure 43; the optical element array structure 41 and the light emitting element structure 43 having been provided as respective separate structures before being assembled together; the optical element array structure 41 comprising a plurality of optical elements 1, wherein the optical elements 1 are catadioptric, reflective or refractive, and the optical elements 1 are arranged in an array; the light emitting element structure 43 comprising a substrate 67 and a plurality of light emitting elements 42 arranged on the substrate; the optical element array structure 41 and the light emitting element structure 43 being arranged such that the optical elements 1 of the optical element array structure 41 are aligned with the light emitting elements 42 of the light emitting element structure 43; and wherein the optical element array structure 41 further comprises electrodes 56, hereinafter referred to as optical element electrodes 56, arranged thereon for providing electrical connection to the plurality of light emitting elements 42.

Thus a method of manufacturing an illumination apparatus whose primary purpose is illumination as opposed to display, may comprise: providing an optical element array structure 41; and providing a light emitting element structure 43; wherein the optical element array structure 41 and the light emitting element structure 43 are provided as respective separate structures; the optical element array structure comprising a plurality of optical elements 1, wherein the optical elements are catadioptric, reflective or refractive, and the optical elements 1 are arranged in an array; the optical element array structure 41 further comprising electrodes 56, hereinafter referred to as optical element electrodes 56, arranged thereon for providing electrical connection to the plurality of light emitting elements 42; the light emitting element structure comprising a substrate 67 and a plurality of light emitting elements 42 arranged on the substrate; and assembling the optical element array structure 41 with the light emitting element structure 43 such that the optical elements 1 of the optical element array structure 41 are aligned with the light emitting elements 42 of the light emitting element structure 43.

Thus an optical element array structure 41, comprises: a plurality of optical elements 1, wherein the optical elements 1 are catadioptric, reflective or refractive, and the optical elements 1 are arranged in an array; the optical element array structure 41 being for being assembled with a light emitting element structure 43 comprising a substrate 67 and a plurality of light emitting elements 42 arranged on the substrate 67 such that the optical elements 1 of the optical element array structure 41 are aligned with the light emitting elements 42 of the light emitting element structure 43; and wherein the optical element array structure 41 further comprises electrodes 56 arranged thereon for providing electrical connection to the plurality of light emitting elements 42 when the optical element array structure 41 and the light emitting element structure 43 are assembled.

The optical elements 1 are directional optical elements arranged to convert the substantially Lambertian output of the light emitting elements 42 into a narrower cone 55 of light beams with a smaller solid angle than the Lambertian output. The cone angle of output is defined as the half angle for half of the peak intensity and may be about 6 degrees for a narrow collimation angle and may be about 45 degrees for a wide (but still with some directionality) cone angle and is typically about 30 degrees or less for directional illumination systems. By way of comparison, Lambertian output cone angle is 60 degrees. To achieve reduced cone angle of light beams 55, directional optics that have a significant étendue varying property, requiring an output aperture size 11 that is significantly larger than light emitting element 42 size are required. For example, a catadioptric optical element arranged for use with a 100 micrometres width light emitting element 42 may have a size 11 of approximately 2 mm. Narrow cone angles in particular require non-imaging catadioptric optics. By way of comparison reflective cups such as described in EP1 890 343 are unsuitable for providing narrow cone angles due to relatively shallow depth required in order to place the LED and electrodes in the cup. This citation shows LEDs which must be placed on top of the cups and then connected in a serial (wirebonded) process to the reflective cups. The light emitting element structure therefore is not provided as a separate structure, (but as individual LEDs), before assembly to the optical element array structure.

An array of optical elements 1 may be provided wherein the optical elements 1 are catadioptric directional optical elements; the array of optical elements 1 being adapted to be aligned with a plurality of light emitting elements 42 arranged in an array to provide an illumination apparatus; wherein: the array of optical elements 1 comprises first electrodes 56, hereinafter referred to as optical element electrodes 56, thereon arranged for providing a first electrical connection to the plurality of light emitting elements 42. The array of optical elements 1 may be adapted to be aligned with the plurality of light emitting elements 42 to provide a light output cone angle of light beams 55 from the illumination apparatus with an output cone angle of less than about 45 degrees and preferably less than about 30 degrees.

Light emitting element 42 arrays and efficient collimating optical elements 1 of the optical element array structure 41 can be fabricated with highly precise separation, for example as described in PCT/GB2009/002340. Advantageously the present embodiments provide electrical connection to electrode 36 for each light emitting element of the array in a single step to reduce assembly cost. Further the light emitting elements are arranged as VTF configuration light emitting elements with lower current crowding effects. The position of the electrode elements can be precisely defined (for example by photolithography) so that their size can be reduced compared to that necessary for wire bonding, and so the loss of light due to shielding by the electrode can advantageously be reduced. Further, the light emitting element are sparsely separated, so that the gaps between the light emitting elements 42 on the optical elements 1 and the support substrate can be used for electrodes in addition to further electronic components including for example resistors, diodes, control signal receivers for Infra Red or RF or integrated circuits to increase device functionality. The light emitting elements may be conveniently attached to a heat sink element to reduce junction temperature and increase device efficiency, further enabling higher current densities to be used, thus providing higher efficiency.

The optical elements 1 may have a spacing region 72 to relieve bending stress in structure 41, and thus provide a flat structure for uniform attachment to the light emitting element array. The array has a top surface 71 which may be planar, may be conveniently anti-reflection coated or may have a surface structure to provide some further optical function to the output ray bundle 55 such as diffuser, lenticular lens array, lens array or prism array.

Thus the embodiment comprises an array of optical elements 1 wherein the optical elements 1 are catadioptric. The optical elements 1 may also be reflective or refractive as will be described below. The array of optical elements 1 are adapted to be aligned with a plurality of light emitting element 42 arranged in an array to provide an illumination apparatus wherein the array of optical elements 1 comprises first optical element electrodes 56 thereon arranged for providing a first electrical connection to the plurality of LED light emitting elements 42. Further, an illumination apparatus comprises the array of optical elements 1 aligned with a plurality of light emitting elements 42.

Figure 4A:
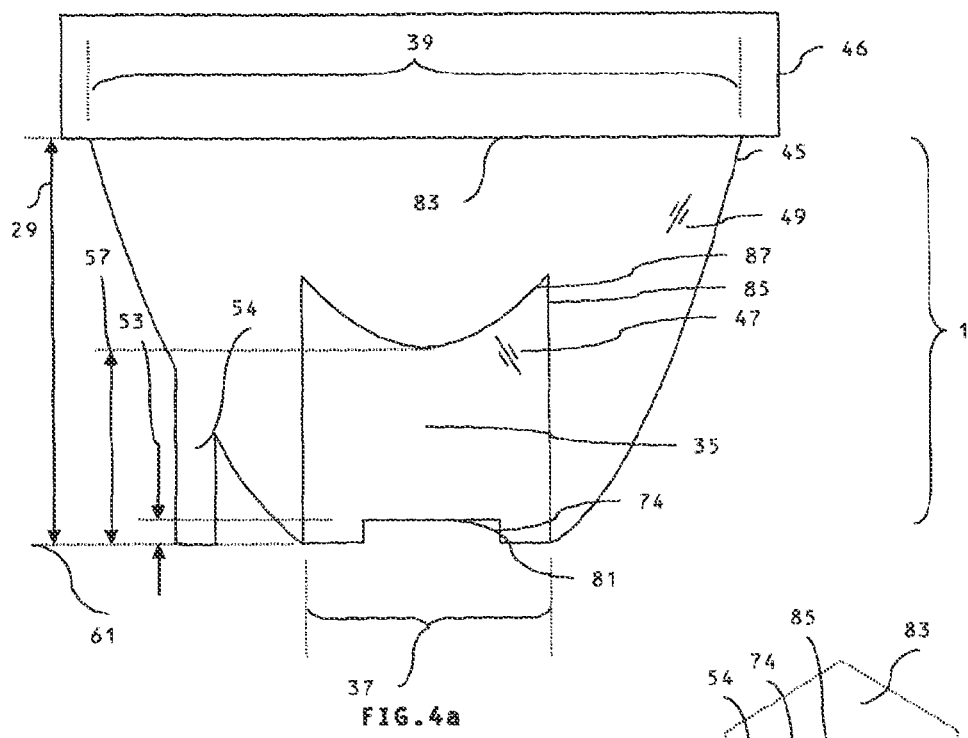
FIG. 4a shows in cross section one catadioptric optical element.
Figure 4B:
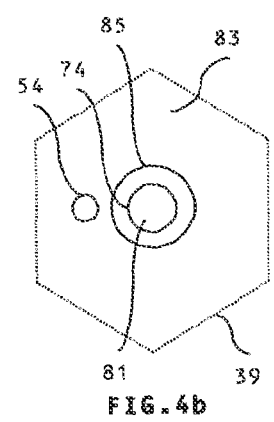
FIG. 4b shows in plan view one catadioptric optical element.

A single catadioptric optical element 1 of array is shown in cross section in FIG. 4a and plan view in FIG. 4b. The optical element 1 is formed on the substrate 46 and comprises a first section 35 comprising a cavity and a polymer material with a first refractive index and a second section 49 comprising a polymer with a second refractive index greater than the first refractive index. The cavity 35 is bounded substantially by wall surface 85, lens surface 87 and input surface 81 of size defined by the aperture 37 of the optical element 1. The second section is bounded by the surfaces 85, 87 and additionally by reflecting surface 45 and output surface 83, of size defined by the aperture 39 of the optical element 1. Both sections comprise polymer materials, wherein the refractive index of the cavity 35 material 47 is lower than the refractive index of the second section material 49. For example, the material 47 may be a silicone material with refractive index approximately 1.4 and the material 49 may be a cross linked UV cured polymer with refractive index 1.56. The first cavity 35 section and second reflective sections are capable of cooperating to direct light from the light emitting elements to the output surface 83 and subsequently through the substrate 46 (which may be formed in the material 49 or may for example be a glass substrate). In particular, substantially all light emitted in a forward or lateral direction is directed through the output aperture 39 into a narrower cone angle than from the original (typically Lambertian) cone.

Thus an array of catadioptric optical elements 1 may be provided; the array of catadioptric optical elements being adapted to be aligned with a plurality of light emitting elements 42 arranged in an array with each light emitting element 42 positioned substantially at an input surface 81 of a respective catadioptric optical element 1, to provide an illumination apparatus, wherein the catadioptric optical elements 1 each comprise: a first section 35 comprising a polymer material with a first refractive index; and a second section 49 comprising a polymer material with a second refractive index greater than the first refractive index; wherein the refractive part of the catadioptric optical characteristic of each catadioptric optical element is provided by a respective interface between its first section 35 and its second section 49, and the respective input surface of each optical element comprises the input surface of its first section 81. The reflective part of the catadioptric optical characteristic of each catadioptric optical element is provided by a reflective surface 45 comprised by its second section 49. The first section 35 may be bounded by an input surface 81 being adapted to be substantially positioned at the light emitting elements 42, a wall surface 85 and a lens surface 87; the second section 49 is bounded substantially by the wall surface 85 and the lens surface 87 of the first section and further bounded by a reflecting surface 45 and an output surface 83; such that the first and second sections 35, 49 are capable of cooperating to direct light from the light emitting elements 42 to an output surface 83. A recess 74 in the input surface 81 may be adapted for alignment with a respective light emitting element of the plurality of light emitting elements 42. A filler polymer material 101 may be comprised between the reflecting surfaces 45 of adjacent optical elements of the array of optical elements 1 wherein the filler polymer material 101 has a substantially planar surface 97 substantially in the plane of the input surface 81 of at least one of the array of optical elements 1 to provide a substantially uniform thickness optical element array structure 41. The reflective part of the catadioptric optical characteristic of each catadioptric optical element 1 may be provided by total internal reflection in the second section 49.

An illumination apparatus may thus comprise an array of catadioptric optical elements 1 aligned with a plurality of light emitting elements 42, wherein the optical elements 1 comprise: a first section 35 comprising a polymer material with a first refractive index; and a second section 49 comprising a polymer material with a second refractive index greater than the first refractive index; the refractive part of the catadioptric optical characteristic of each catadioptric optical element is provided by a respective interface between its first section 35 and its second section 49; and wherein each light emitting element 42 is positioned substantially at an input surface 81 of the first section 35 of its respective optical element 1. The reflective part of the catadioptric optical characteristic of each catadioptric optical element 1 may be provided by a reflective surface 45 comprised by its second section 49.

Advantageously, such an arrangement provides for highly efficient coupling of light. In particular, the cavity does not comprise air and so Fresnel reflections are reduced, thus increasing output efficiency and reducing illumination apparatus cost. Further, by way of comparison with known macroscopic LED systems of thickness typically 10 mm, the low thickness of the present embodiments reduce the internal absorption in the materials 47, 49. Advantageously, the low thickness reduces the amount of materials so that higher cost per unit volume materials can be used without increasing overall device cost.

The input surface 81 is adapted to be substantially positioned at the light emitting elements 42. The surface 81 may be plane, or for example may comprise a recess 74 may be formed to provide a region for the light emitting element 42 to be inserted so that in operation light directed laterally from the light emitting element 42 is collected by the wall surface 45 of the optical element 1. Typical thin film LED light emitting elements have a thickness of less than 10 micrometres. Thus for a 100 micrometre width LED device, thickness 29 may be about 1 mm, thickness 57 may be about 0.5 mm and thickness 53 may be about 50 micrometres or less. Alternatively, the recess walls may have a height to accommodate a light emitting element mounted on a support substrate, such as sapphire wafer or silicon, in which case its thickness may be greater.

As shown in FIG. 4*b*, the output aperture 39 may be hexagonal in shape, or alternatively may be other shapes such as round or square for example. The optical element electrode 56 may comprise a thin strip comprising a linear feature to advantageously optimise the proportion of the reflector that uses total internal reflection, TIR rather than metallic reflection, thus increasing efficiency. The electrode 36 may be extended in an orthogonal direction to the optical element electrode 56 to reduce alignment tolerance between the two components.

Figure 5A:
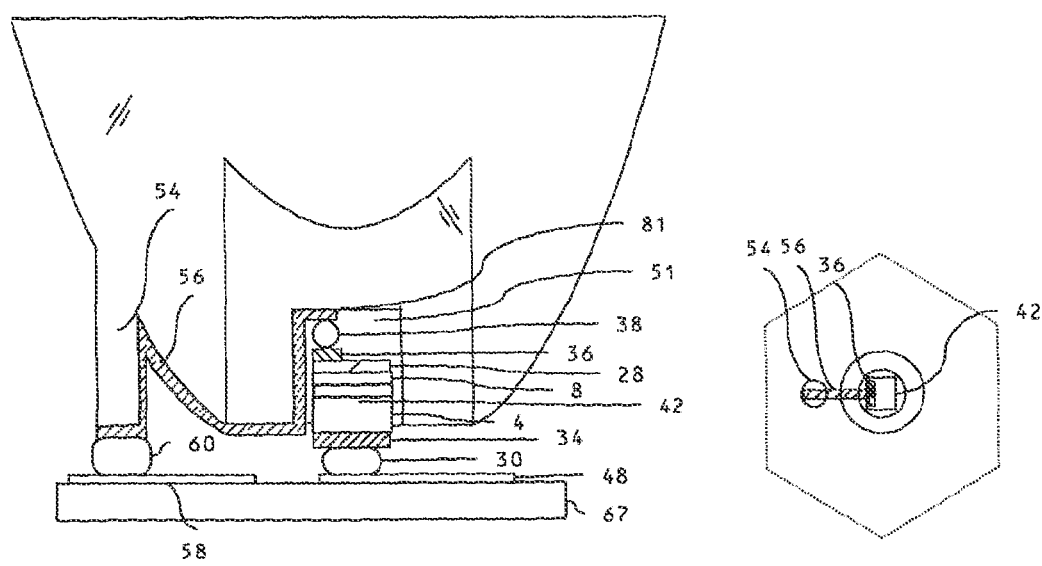
FIG. 5a shows in cross section electrical connection of a light emitting element to a catadioptric optical element.
Figure 5B:
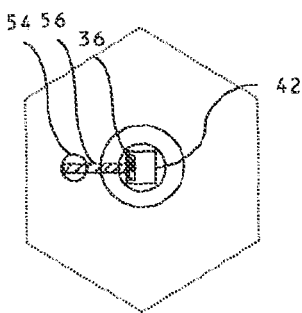
FIG. 5b shows in plan view electrical connection of a light emitting element to a catadioptric optical element.

A schematic detail of a single light emitting element 42 and aligned optical element 1 of FIG. 3 is shown in cross section in FIG. 5*a* and plan view in FIG. 5*b*. For illustrative convenience, the height of the recess 74 in the input surface 81 has been increased. Electrode 56 is formed on part of the surface 81 and is thus in the region that provides an optical imaging function of the catadioptric optical element 1. The p-doped layer 8 of LED light emitting element 42 is attached to optical element electrode 56 by means of solder 38. Thus the optical element electrodes 56 are, at least in part, positioned on a part (such as surface 81) of the optical elements 1 that has a shape profile or a material composition profile of the optical element 1 that is related to the catadioptric, reflective or refractive characteristic of the optical element. The electrode 56 is positioned on part of the surface 81 of the optical elements 1 so that it is near an input aperture defined by aperture 37 in plane 61 (shown in FIG. 4*a*) of the optical elements 1. That is the surface 81 is near the input aperture within less than about 10% of the thickness 29 of the optical element 1, and preferably less than about 5% of the thickness 29 of the optical element 1. Further the optical element electrodes 56 are positioned on part of the optical elements 1 that is between the input aperture and an output aperture of the optical elements 1. Advantageously, as the optical element electrode 56 is on the surface 81, the light emitting element 42 is thus arranged to be at a location from which light can be efficiently collected by the catadioptric optical element 1.

The n-doped layer 4 of LED light emitting element 42 is connected by means of reflective electrode 34 and solder 30 to substrate electrode 48. The optical element electrode 56 is connected to substrate electrode 58 by means of solder 60. Thus the first optical element electrodes 56 are further arranged for providing an electrical connection to substrate electrode 58. The first optical element electrodes 56 are thus at least in part, positioned on a part of the optical elements 1 (such as connecting structure 54) that has a shape profile substantially arranged to provide a contact between the first optical element electrodes 56 and the substrate electrodes 58. Thus the optical elements 1 further comprise pillar regions such as structures 54 wherein the first optical element electrodes 56 are, at least in part, positioned on the pillar regions.

The solder attachment method may be provided (using the example of solder 38) by forming metal layers such as palladium or other known electrode material layers (not shown) on the optical element electrode 56 and the electrode 36. A further metal layer such as an indium layer may be formed on one of the palladium layers. On heating for example to about 180 degrees Celsius and application of pressure between the two electrodes 36, 56 the palladium and indium alloy, providing a mechanical, thermal and electrical joint. Such alloying step can advantageously be provided in parallel across the array of light emitting elements 42 and optical elements 1 with electrodes 56, reducing assembly cost. The metal layers may comprise other known electrode materials including but not limited to gold, indium tin oxide, titanium, aluminium, tin, platinum and nickel.

Figure 6:
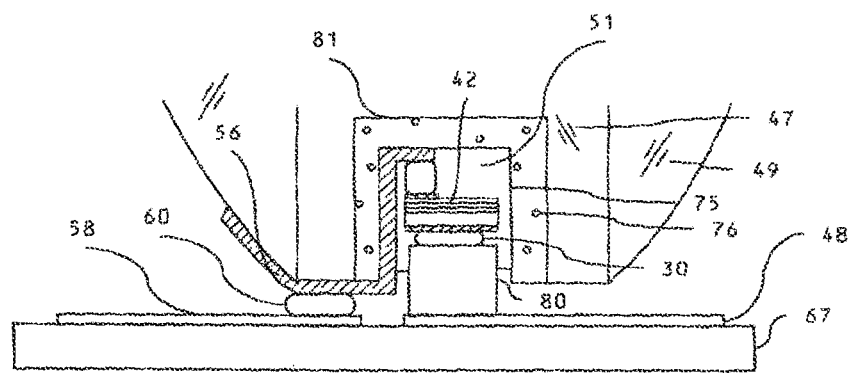
FIG. 6 shows in cross section a detail of another electrode attachment apparatus.

For a white light source, the light emitting elements of the array may comprise separate red, green and blue LEDs. However, a wavelength conversion layer 76 for example comprising a phosphor material may be incorporated as shown in FIG. 6 in combination with a blue emission LED 42. The phosphor layer 76 may be formed on the surface 81 and the optical element electrode 56 positioned on the internal surface 75 of the layer 76. Such a layer 76 remains related to the catadioptric, reflective or refractive characteristic of the optical element. The optical elements 1 thus comprise a wavelength conversion material. A further index matching material 51 may be inserted to improve optical coupling between the light emitting element and the array of optical elements 1. FIG. 6 further shows an alternative cross section to that shown in FIG. 4 wherein the connecting structure 54 comprises part of the surface 81, and optical element electrode 56 attaches to the substrate electrode 58 by means of solder 60. Such an embodiment advantageously reduces the complexity of the optical element. A further electrically and thermally conductive pillar 80 may be incorporated to mount the light emitting element further within the cavity 35 of the optical element.

Figure 7:
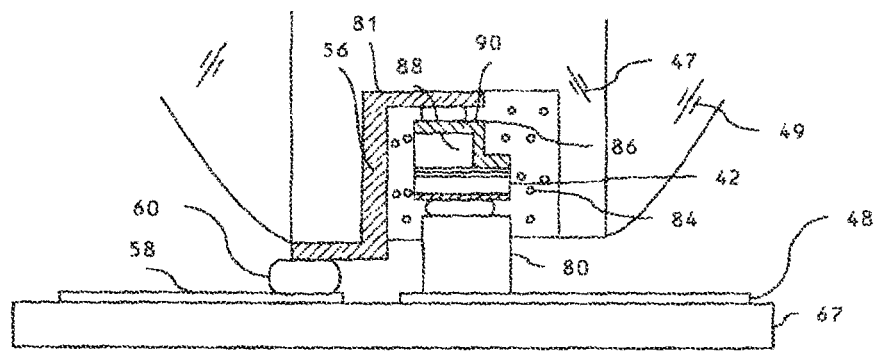
FIG. 7 shows in cross section a detail of another electrode attachment apparatus.

FIG. 7 shows an alternative cross section to that shown in FIG. 6 wherein a wavelength conversion layer region 84 is formed after electrode connection of the light emitting element 42. A further conductive pillar 88 may be added to the top of the light emitting element 42 or to the surface 81 to provide a connection element to increase the thickness of the region 84 above the light emitting element 42 to the optical element electrode 56. Such embodiment provides the electrode to be formed and light emitting element 42 to be attached prior to the introduction of the phosphor layer. The material 84 could further incorporate a conductive material so as to provide electrical connection between the electrode 90 of the light emitting element 42 and electrode 56. In this case, further dielectric layers (not shown) may be applied to the light emitting element to prevent undesirable short circuits.

Figure 8:
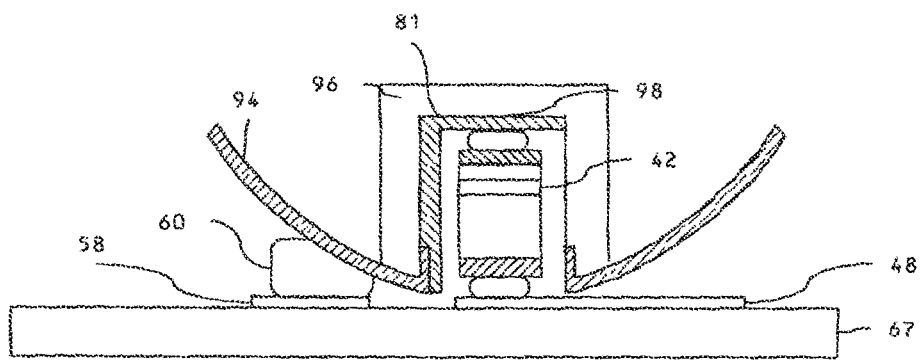
FIG. 8 shows in cross section a detail of another electrode attachment apparatus.

FIG. 8 shows an embodiment wherein the optical element comprises a reflective optical element 94 in which the walls of the reflective element are a formed metal reflector. An electrode support element 96 with electrode 98 and surface 81 may be formed near the input aperture with optical element electrode 98 attached to the reflector 94 to provide a conductive path to substrate electrode 58. The electrode support element 96 may further comprise a hemispherical output shape to optimise light output coupling efficiency. Advantageously such an optical element 94 may have a lower cost than the catadioptric optical elements described previously, although it may have lower efficiency. This arrangement may be suited to wider angle optical output, for example greater than about 30 degrees HWHM (half width half maximum), collimation compared to less than about 10 degrees HWHM possible with catadioptric optical elements.

Figure 9:
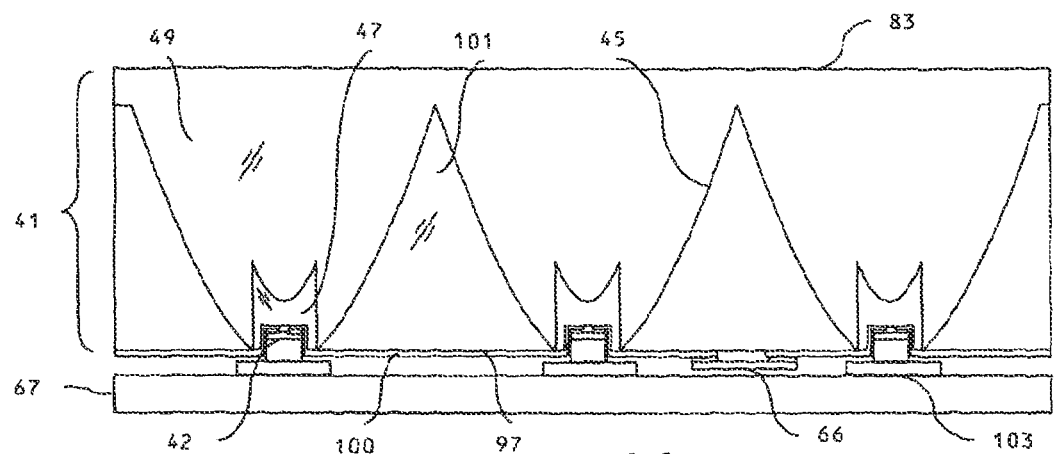
FIG. 9 shows a further illumination apparatus comprising an electrical connection apparatus integrated with an optical apparatus.
Figure 10:
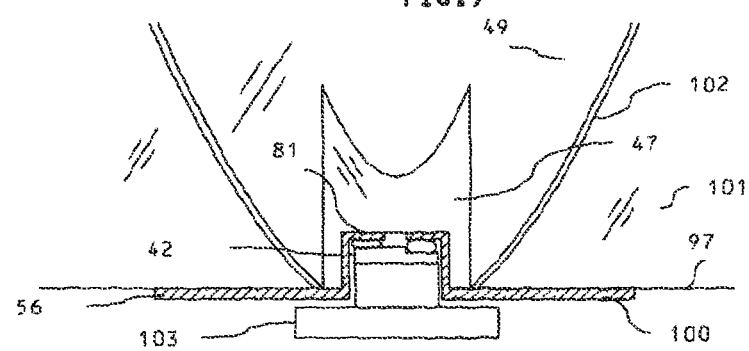
FIG. 10 shows a detail of an electrical connection apparatus integrated with zap optical apparatus.

FIG. 9 shows a further embodiment, shown in detail in FIG. 10 in which an array of lateral configuration LEDs 16 comprising light emitting elements 42 is used with first optical element electrodes 56 and second optical element electrodes 100, to provide first and second connection to the light emitting elements 42. In an LED string, the second optical element electrode 100 for one light emitting element 42 becomes the first second optical element electrode 56 for adjacent light emitting elements 42. Both electrodes are positioned on a structure 41 comprising an array of catadioptric optical elements 1, and provide electrical connection on part of the surface 81 in the light directing part of the catadioptric optical element 1. Thus for at least some of the plurality of light emitting elements 42 a first electrical connection to the light emitting element 42 is provided by a first optical element electrode 56 and a second electrical connection to the light emitting element is provided by a second optical element electrode 100.

The surface 45 may be coated with a reflective material 102, and the gap between the optical elements 1 filled with a material 101, which may be the same as material 49 to provide a uniform structure and optimise flatness for attachment of electrodes 56, 100 and LEDs 16. Thus the catadioptric optical elements may further comprise a filler polymer material 101 between the reflecting surfaces of adjacent optical elements 1 of the array of optical elements 1. The filler polymer material 101 may have a substantially planar surface 97 substantially in the plane of the surface 81 of at least one of the array of optical elements 1 to provide a substantially uniform thickness array of optical elements. Advantageously, such an embodiment may advantageously provide a flexible optical and electronic structure.

Thus the array of optical elements 1 comprises second optical element electrodes 100 thereon arranged for providing a second electrical connection to the plurality of light emitting elements 16. Thus first and second electrical connections to each of the plurality of light emitting elements are provided by the respective first and second optical element electrodes. Further at least one first optical element electrode 100 is formed on a substantially planar surface 97 formed between at least two optical elements 1 of the array of optical elements 1.

Further heat spreader elements 103 may be incorporated between the light emitting element 42 and support substrate 67 to advantageously reduce the thermal resistance of the mounted light emitting element 42. The heat spreader may comprise for example a metal layer or a silicon layer. Further electronic components 66 may be arranged in the regions between the optical elements 1 of the array. Such arrangement provides a first substrate that provides electronic and optical functions and a second substrate that provides heat-sinking functions. Advantageously the embodiment does not require bonding of electrodes onto the heat spreader 103, simplifying the optical structure of the substrate 67, thus reducing cost. In other embodiments, such heat spreaders 103 can also be used in combination with VTF configuration LEDs 17.

Figure 11:
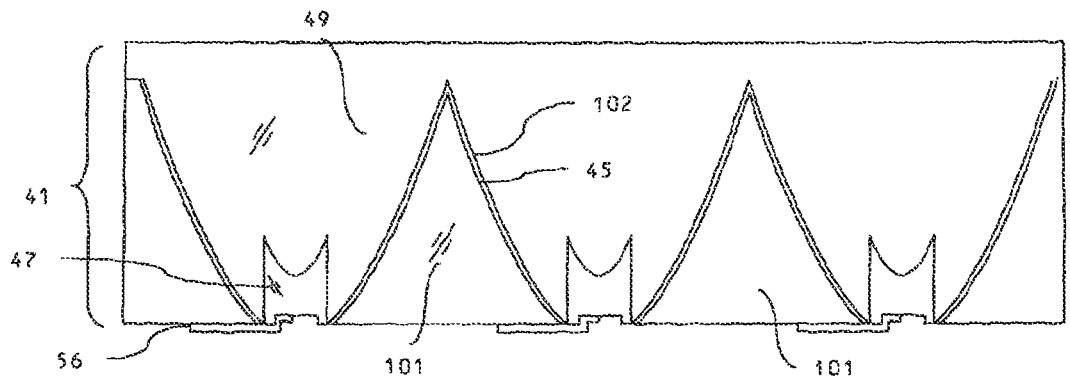
FIG. 11 shows one array of optical elements with integrated electrodes.

FIG. 11 shows an optical element array structure 41 comprising an array of optical elements 1 comprising catadioptric optical elements for use in the illumination apparatus similar to that shown in FIG. 3. The surfaces 45 are coated with a reflective material 102 and an additional material 101 is incorporated between the optical elements 1.

Figures 12, 13:
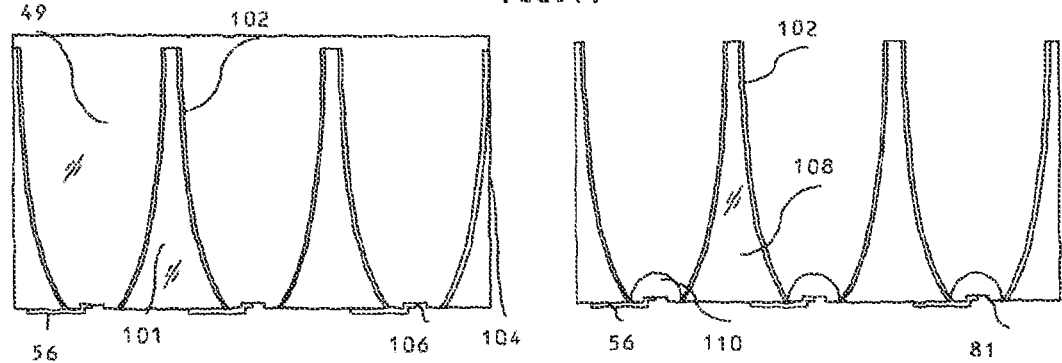
FIG. 12 shows a further array of optical elements with integrated electrodes.
FIG. 13 shows a further array of optical elements with integrated electrodes.

FIG. 12 shows a reflective compound parabolic concentrators 104 (CPC) for use in illumination apparatus. Each element may incorporate a recess for electrode attachment and insertion of the light emitting element 42. Advantageously such an arrangement may provide lower degree of collimation than the element of FIG. 11 with a more uniform spot profile and more defined penumbra in the output illumination beam structure.

FIG. 13 show reflective CPCs formed from structures 108 with a reflective coating 102 incorporating further hemispherical optics 110 into which light emitting elements 42 are inserted. Hemispherical optics advantageously couple light from the light emitting element into air efficiently and can be incorporated into the same moulding as the structures 108 or added in a secondary process. Such a structure advantageously uses less material than that shown in FIG. 12. Thus the part of the surface 81 of optical element 1 on which the electrodes 56 are formed comprises part of a surface of a refractive lens 110.

Figure 14:
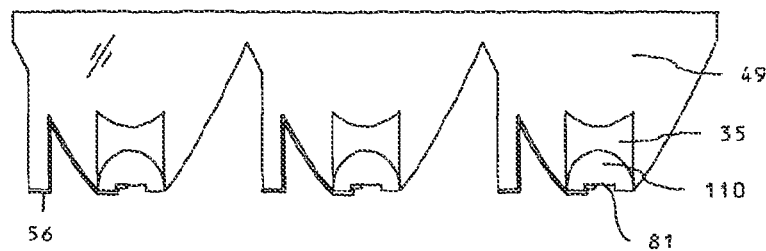
FIG. 14 shows a further array of optical elements with integrated electrodes.

FIG. 14 shows an alternative embodiment of optical element array structure 41 in which the cavity 35 is filled with air and hemispherical optics 110 are incorporated in the structure and have the electrode structure applied. Advantageously such a structure has a lower thickness and higher spatial density of optical elements 1 than the optical structure in FIG. 3.

To achieve high precision of separation, the plurality of light emitting elements 42 such as LEDs 16 or LEDs 17 of the present embodiments may be from a monolithic wafer with their separations preserved, and wherein the plurality of passed light-emitting elements that are selectively removed from the monolithic array may be selected such that, in at least one direction, for at least one pair of the selectively removed passed light-emitting elements in the at least one direction, for each respective pair there is at least one respective light-emitting element that is not selected that was positioned in the monolithic array between the pair of removed passed light-emitting elements in the at least one direction, as described in PCT/GB2009/002340.

Figure 15A:
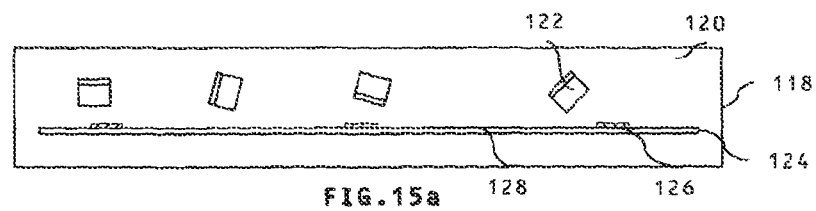
FIG. 15a shows a method for self assembly of an LED array.
Figure 15B:
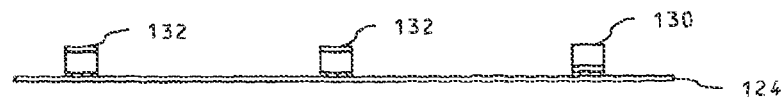
FIG. 15b shows a self assembled array of LEDs.
Figure 15C:
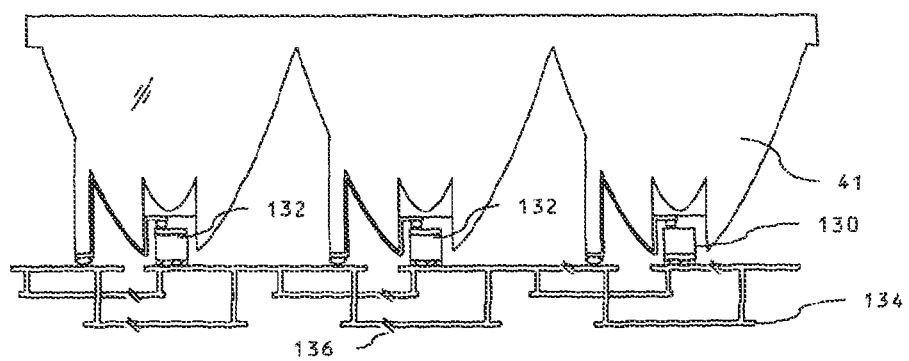
FIG. 15c shows a method to connect an array of optical elements with integrated electrical connections to the array of FIG. 15b.

Alternatively, the separation of the light emitting elements may be achieved by means of self assembly. FIG. 15a shows the self assembly of light emitting element into a precision array. A container 118 is filled with a liquid 120 and diced LED 122. A substrate 124 has an array of conductive adhesive regions 126 (which may be solder regions), interspersed by non adhesive regions 128 (such as resist) formed on its surface. As shown in FIG. 15b, the LEDs 122 may be coated so as to preferentially attach in a first orientation 132 with either p-doped layer up or a second orientation 130 with n-doped layer up. FIG. 15c shows the alignment of the LEDs 122 with an optical element array structure 41. In operation, the LEDs 122 of the array are typically configured with n-doped layer of a first element attached to the p-doped layer of an adjacent LED 122. In such a self-assembled device, the orientation of the LED 122 may not be clear until the elements are tested. In this case, the electrodes may require reconfiguring to set the appropriate polarities. The orientation of the LED 122 may be determined by inspection or electrical testing. For example electrodes 134 may be cut in regions 136, for example by means of laser culling. Advantageously connectivity to self assembled LED 122 arrays is provided. By way of comparison, if the LEDs 122 were lateral configuration type, each LED 122 would need to have a rotational orientation so that for example the etched regions 12 in FIG. 1 are aligned up with the relevant region in each adhesive region 126. Advantageously in the present embodiments, the rotational orientation is not critical as the devices are VTF configuration type and connected to the electrode on the optic array.

Figure 16:
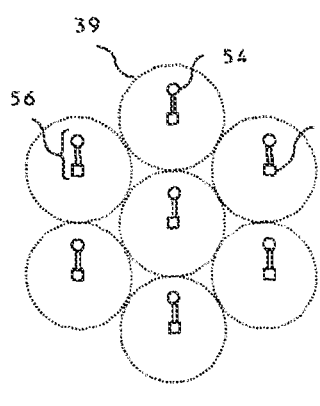
FIG. 16 shows in plan view one electrical connector array integrated with an array of optical elements.

FIG. 16 shows in plan view light emitting element 42, connecting structure 54 and optical element electrode 56 for optical elements 1 of the present embodiments. Advantageously, the light emitting elements of the array may be arranged in strings to provide a number of light emitting elements to be connected in series. In this embodiment, the hexagonal output aperture 39 of FIG. 4b is replaced by circular output aperture 39. Advantageously, circular output apertures may provide more axially symmetric directionality than hexagonal elements. Further, in the present embodiments the small size of the optical elements 1 means that the detailed structure of the output apertures may not be easily resolved by observers, so that the output aperture of the whole array of apertures 39 appears substantially uniform and thus has improved cosmetic quality by way of comparison with macroscopic light emitting element arrangements.

Figure 17:
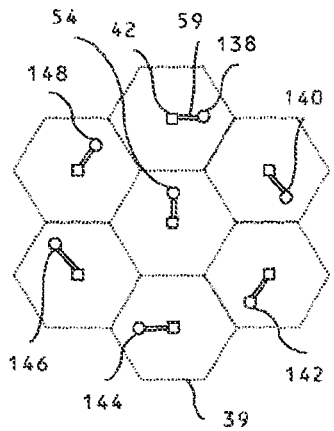
FIG. 17 shows in plan view a further electrical connector array integrated with an array of optical elements.

FIG. 17 shows in plan view the optical element array structure 41 of FIG. 3b wherein the relative position of each structure 54 is different for optical elements 1 of the array, with structures 54, 138, 140, 142, 144, 146, 148 with different relative positions for a single rosette. Such an embodiment advantageously averages out over the array the loss of reflectivity in the area around the pillar so that the combined optical output is substantially uniform. Thus the optical element electrodes 56 comprise a substantially linear feature 59 and the orientation of one first optical element electrode linear feature (for example with structure 140) is different to the orientation of at least one other first optical element electrode linear feature (for example with structure 142).

Figure 18:
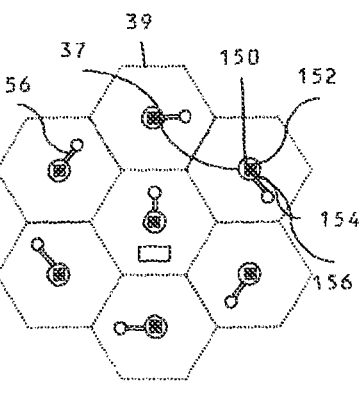
FIG. 18 shows in plan view a further electrical connector array integrated with an array of optical elements.
Figure 19:
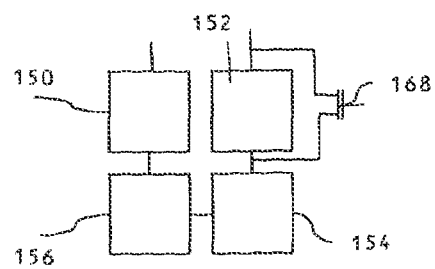
FIG. 19 shows a detail of the LED elements of FIG. 20 in which a redundant LED is provided.

FIG. 18 shows an arrangement in which four light emitting elements 42 comprising LEDs 150, 152, 154, and 156 (shown in more detail in FIG. 19 below) provide light emitting sub-elements, and are positioned in the input aperture 37 of each optical element. Such an arrangement provides compensation for short circuit loss of a single element during the lifetime of the element. FIG. 19 shows a detailed arrangement for the connections to the LEDs in FIG. 18. At least one optical element 1 of the optical element array structure 41 of FIG. 3b is aligned with at least two light emitting sub-elements. This provides some LED redundancy in the event of device failure. When controlled from a constant current supply, a string of LEDs produces a defined light output. If one of the LEDs 150, 154, 156 fails short circuit, the voltage drop of the respective LED is lost, but for a constant current supply the current through the remaining LEDs remains the same as opposed to increasing as would have happened with a constant voltage supply. Nevertheless the light output is reduced by the short circuit failure of one LED. In normal operation, active device 168 for example a transistor is on, effectively shorting LED 152 so that it does not emit. When short circuit failure of one of the other LEDs (150, 154, 156) is detected, then active device 168 is turned off which provides LED 152 to turn on and thereby restoring the overall output to the pre-failure value. An active semiconductor device such as transistor 168 is arranged to provide switching of at least one of the light emitting sub-elements. Other active devices such as triacs, thyristors or integrated circuits can be used in cooperation with the light emitting elements.

Electrode layers may be formed on optical elements 1 as described in the illustrative embodiments of FIGS. 20 and 21. FIG. 20a shows in plan view an array of optical elements 400 comprising an input aperture 402 and an electrode support structure 404. FIG. 20b shows a mask 406 used to form electrode pattern on the array of FIG. 20a comprising aperture regions 408 and shielding regions 410. FIG. 20c shows the optical elements 400 after formation of electrode 412 comprising light emitting element 42 contact region 414 and backplane contact region 416. As shown in FIG. 20d in cross section, metal material 417, such as aluminium, gold or Indium Tin Oxide (ITO) is deposited for example sputtered onto the surface of the mask and is transmitted through apertures in the mask to provide electrode 412. Advantageously such an arrangement can provide a high precision of electrode alignment to optical structures.

Figure 20A:
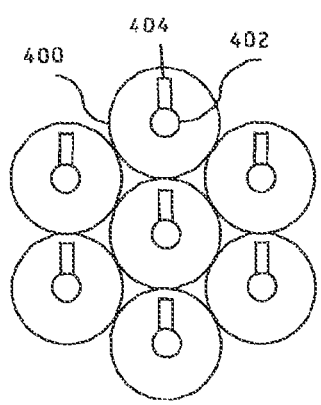
FIG. 20a shows in plan view an array of optical elements prior to forming an electrode array.
Figure 20B:
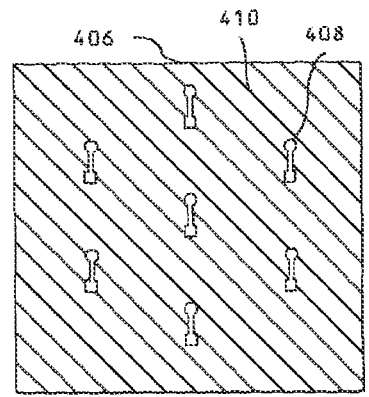
FIG. 20b shows in plan view a mask comprising an aperture array.
Figure 20C:
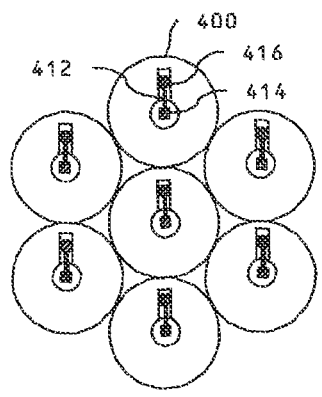
FIG. 20c shows in plan view an optical array with an electrode array formed with the mask of FIG. 20b.
Figure 20D:
FIG. 20d shows in cross section the optical array of FIG. 20c.
Figure 20E:
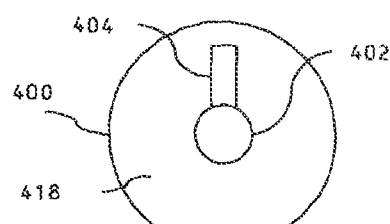
FIG. 20e shows in plan view an optical element.
Figure 20F:
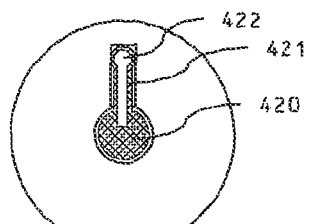
FIG. 20f shows in plan view an optical element in which a first region is electrically isolated from a second region.

FIG. 20e shows one optical element 400 of an array of optical elements on which a metallic coating 418 is formed. In a material removal step, a region of the opaque metal material is removed through a coating such as a photoresist coating and etch steps (as well known in the art), or may be by means of laser ablation for example. As shown in FIG. 20f, the region of removed material may be arranged to provide a transparent region 420 for light transmission from the light emitting element and an electrical isolation region 421 so that the contact between the light emitting element and the backplane is through electrode 422. Advantageously the whole of the optical element 400 surface can be conveniently pre-coated with metal to provide both reflection and electrical connection properties.

Figure 20G:
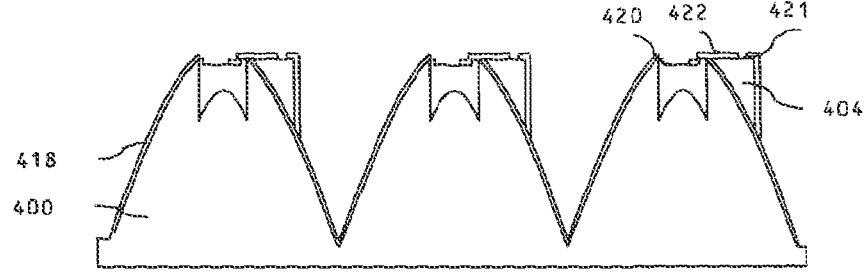
FIG. 20g shows in cross section an array of optical elements of FIG. 20f.
Figure 20H:
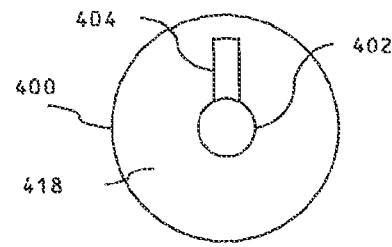
FIG. 20h shows in plan view an optical element.
Figure 20I:
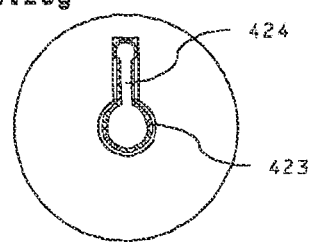
FIG. 20i shows in plan view an optical element in which a first region is electrically isolated from a second region.

FIG. 20g shows an array of the elements of FIG. 20f in cross section. FIG. 20h shows an alternative embodiment in which the material 418 is a transmissive conductive material such as ITO. After a metal removal step, as shown in FIG. 20i, an electrical isolation region 423 and a connecting electrode region 424 are formed. Advantageously, a large contact area to the light emitting element is provided to reduce the required alignment precision of the electrode to the light emitting element.

Figure 21A:
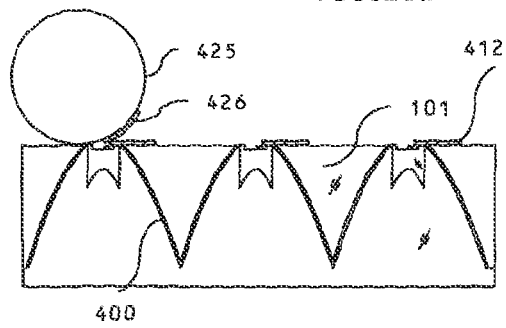
FIG. 21a shows a method to form an array of electrode elements on an optical element.
Figure 21B:
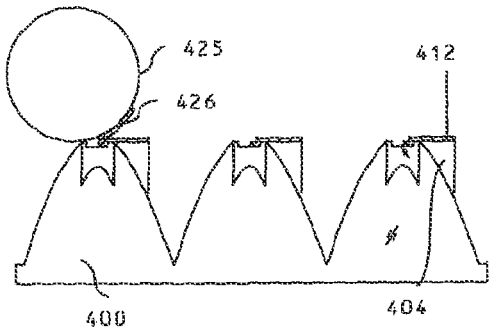
FIG. 21b shows a further method to form an array of electrode elements on an optical element.

FIG. 21a shows a further method to form the electrode regions. An array of optical elements 400 comprising supporting material 101 is selectively over-coated by means of a printing process such as ink jet (not shown) or a coating roller 425 with a conductive material 426 such as a conductive ink, to form electrode 412. In FIG. 21*b* as similar arrangement is used to provide electrode 412 where the structure 404 provides a platform for the coating roller and conductive material 426.

Figure 21C:
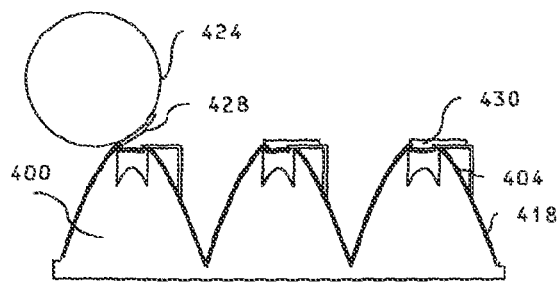
FIG. 21c shows a method to form a photoresist layer on an optical element.
Figure 21D:
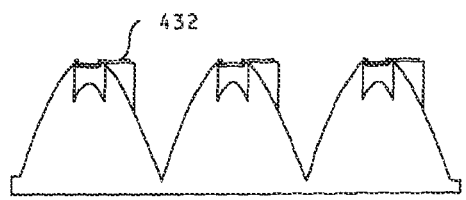
FIG. 21d shows the optical element of FIG. 21c following an etch step.

FIG. 21*c* shows a further method to form the electrode regions. Array of optical structures 400 is coated with a metal layer and then a material 428 such as a photoresist or other etch resist material is selectively over-coated on the array to provide coated regions 430. The optical element is then etched and the material in regions 430 removed to provide electrodes 432 as shown in FIG. 21*d*.

Figure 22:
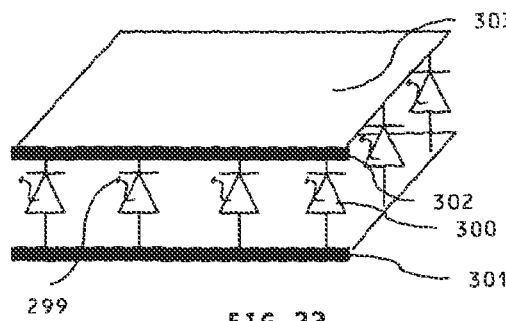
FIG. 22 shows a connection apparatus for an array of LEDs.

An electronic control apparatus for an illumination apparatus may be provided wherein respective electrodes are arranged for connecting at least two light emitting elements of the plurality of light emitting elements. The electrical connection apparatus for the arrays of light emitting elements of the present embodiments, which may be one dimensional or two dimensional arrays, may comprise several different arrangements, Two or more of the LEDs 300 may be connected in parallel between common electrodes 301 and 302 as shown in FIG. 22. Light emitting diodes are shown with output light 299 emission. Electrodes 301 or 302 may take the firm of a sheet electrode, 303. This requires a low-voltage high-current supply, and this arrangement works best if all the individual LEDs are very well matched electrically. This arrangement is vulnerable to LED short circuit failure, but can tolerate open circuit failure. Thus respective electrodes are arranged for connecting a plurality of light emitting elements in parallel.

Figure 23:
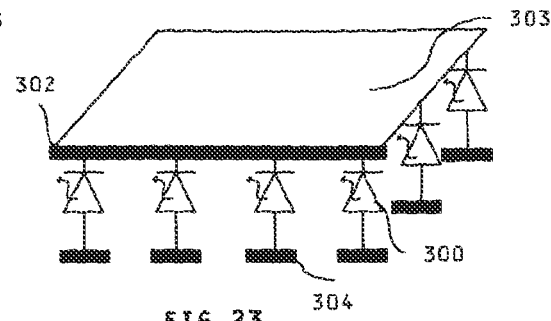
FIG. 23 shows a further connection apparatus for an array of LEDs.

FIG. 23 shows that two or more of the LEDs 300 may be connected to common electrode 302 which may take the form of a sheet electrode 303. The common electrode may be the anode or the cathode (shown). For a two dimensional array of n×m LEDs (where n and m are integers) this may be driven by n×m current sources (not shown) each connected to each of an electrode 304 of respective LED 300. Alternatively each LED can have a series resistor (not shown) so that when the all the resistors are connected together to a constant voltage supply (not shown) the resistors promote current sharing. The resistors associated with each device may be integrated in the LED structure or external for example as shown as element 66 in FIG. 3. The function of a resistor for each LED may also be implemented by a uniform resistive layer (not shown), termed a ballast layer, between the LET) electrodes and a common electrode.

Figure 24:
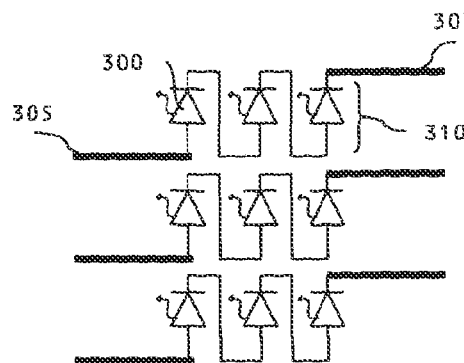
FIG. 24 shows a further connection apparatus for an array of LEDs.
Figure 25:
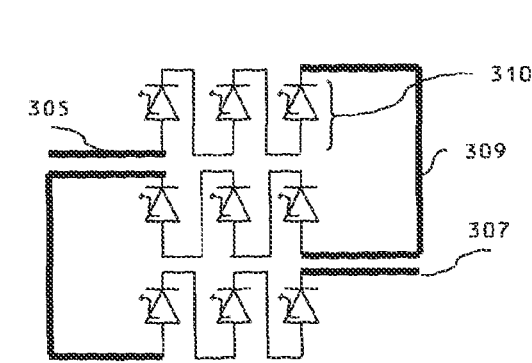
FIG. 25 shows a further connection apparatus for an array of LEDs.

FIG. 24 shows LEDs 300 connected in series strings 310, each of which may be driven by a current source (not shown), and connected by means of electrodes 305, 307. Thus respective electrodes are arranged for connecting a plurality of light emitting elements in series directionally to form a string, in series directionally means the cathode of one device is connected to the anode of the next device in series. This arrangement also reduces the number of current sources compared to FIG. 23 and means that the current source may operate at higher voltage. Each string still functions if an individual LED fails short circuit. An open circuit failure disables only the string it is in. If required open circuit failures of an individual device can be prevented from disabling the whole string at the cost of incorporating Open Circuit Protectors (not shown) in parallel with the LED to be protected. Suitable protectors include the PLED family marketed by Littlefuse (Chicago, Ill.). To reduce components count, one Open Circuit Protector can be configured to protect for example two LEDs in series, however if only one LED fails, both will be dark. Alternatively a zener diode (not shown) can be configured in anti-parallel with each LED, or LED pairs. The zener voltage should exceed the forward voltage drop of LED(s) it is protecting. LEDS may be protected from Electro-Static Discharge (ESD) damage by incorporating ESD protection devices such as ESD diodes. These devices can be configured in parallel with one or more LEDs or connected at the external electrodes of the LED array. The individual strings 310 of LEDs 300 of FIG. 24, which may for example correspond to a row of n devices in the LED array, may themselves be connected in series for example by electrodes 309 to further reduce the number of drive circuits, or to raise the operating voltage to be more compatible with the available supply for example as in FIG. 25. The electrical arrangement discussed above can apply to a spatially different topology of the LED array for example hexagonal or square. The LEDs connected in a string need not be adjacent and may be spatially separated to promote optical uniformity in the event that a particular string fails.

The drive circuit for the plurality of light emitting elements may comprise at least one current source.

Figure 26:
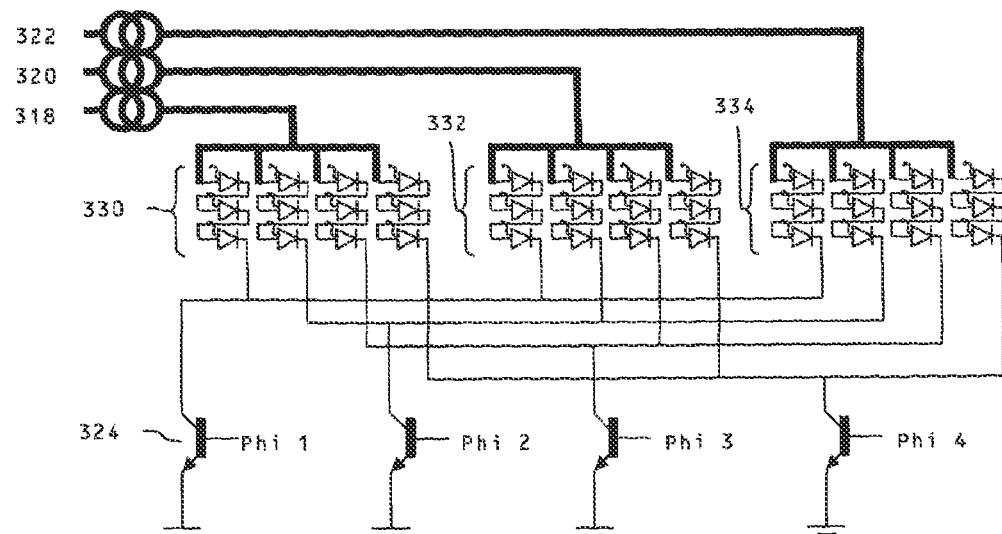
FIG. 26 shows a further connection apparatus for an array of LEDs.

Current sources may be multiplexed to multiple strings of light emitting elements as shown schematically in the illustrative embodiment of FIG. 26. In operation current source 318 is connected to group of 4 parallel strings 330 of LEDs. Current sources 320, 322 etc. are similarly connected to strings 332, 334. In a first illumination phase (phi 1) the first of the 4 parallel strings in each of groups 330, 332, 334 is connected to the respective current sources and is turned on (e.g. grounded by means of transistor 324). In phase two, the current sources are used to control the second string in each group. At least one current source 322 may thus be multiplexed to multiple strings of light emitting elements 42. This system has the advantage of reduced number of current sources. Multiplexing the current sources also reduces the number of electrical connections that are needed to the array.

Figure 27:
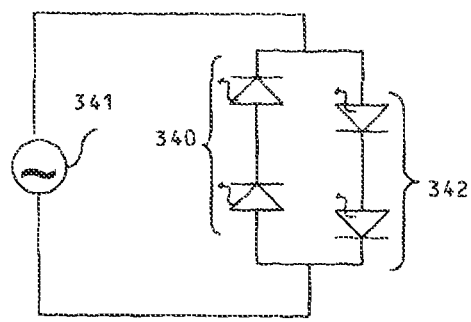
FIG. 27 shows a further connection apparatus for an array of LEDs.
Figure 28:
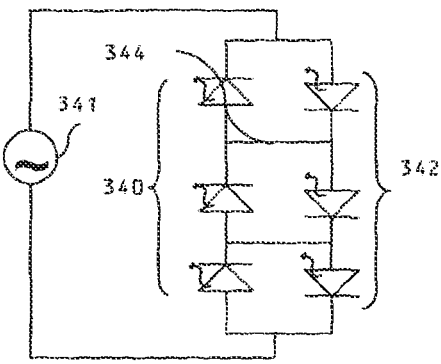
FIG. 28 shows a further connection apparatus for an array of LEDs.

The array may also have some LEDs connected in arrangements intended for AC operation. FIG. 27 shows an AC power source 341 and a basic opposed strings 340, 342 each comprising one or more LEDs 300. Each string illuminates on opposing polarity (usually half cycles) of the AC waveform. The string may contain enough devices to make the total forward diode voltages suitable to the AC voltage available. If the current is limited, for example by a resistor (not shown), then the circuit has some tolerance to short circuit failures of LEDs. Unless protected open circuit failure of a LED will disable whichever of the string 340, 342 the failed device is in. The strings may also further comprise a connecting link 344 as shown in FIG. 28. A short circuit failure in any LED also disables the LED electrically in parallel. Disadvantageously this arrangement is not tolerant to open circuit failure.

Figure 29:
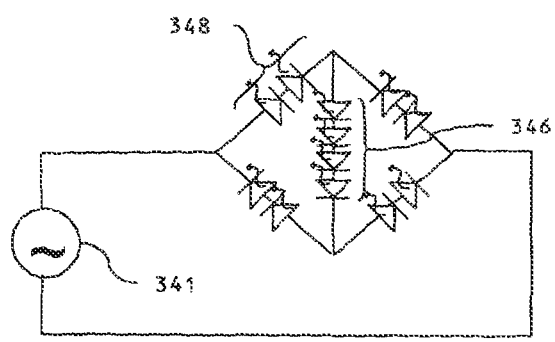
FIG. 29 shows a further connection apparatus for an array of LEDs.

Some or all of the devices of the array may be configured as one or more bridge circuits e.g. half wave bridge circuits (not shown) or full wave bridge circuits as illustrated in FIG. 29. The arms of the bridge contain light emitting rectifying diodes. This circuit has the advantage that the centre string 346 emits on both positive and negative cycles of the AC power source 341. Sufficient light emitting diodes are needed in the arms 348 of the bridge (two are shown for illustration in each arm) to sustain the reverse voltage of the AC waveform from the source 341. For a typical AC waveform, these LEDs in the arms 348 only emit on half the cycles.

Figure 30:
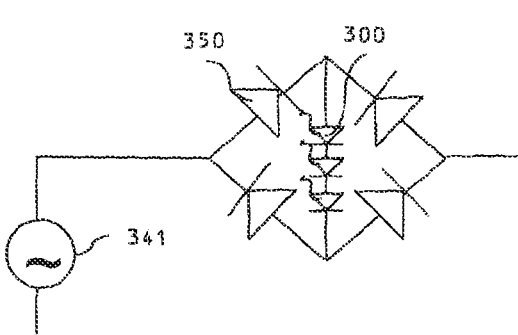
FIG. 30 shows a further connection apparatus for an array of LEDs.

FIG. 30 illustrates another approach where the bridge is provided by non light-emitting rectifier diodes 350 in each arm that have a high reverse voltage tolerance and preferably a low forward voltage for example silicon diodes. This embodiment provides all the LEDs 300 to emit on positive and negative cycles of the AC source 341. Such a silicon diode bridge is conveniently incorporated with the array embodiments, for example element 66 in FIG. 3.

The control circuitry associated with the above embodiments may also incorporate one or more of features such as power factor correction, current limit, over temperature and over voltage protection, as is known in the art. The control circuitry may also incorporate and Infra Red or wireless RF receiver to provide control of the functions of the lamp.

Figure 31:
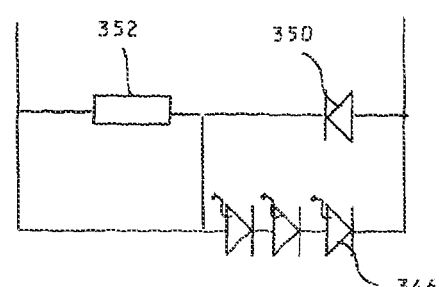
FIG. 31 shows a further connection apparatus for an array of LEDs.

Strings of LEDs may be used for high voltage DC operation without needing a bridge circuit. Any reverse voltage including possible transients across the LED string 346 may be clamped with for example a silicon diode 350 and a high value (e.g. one mega-ohm) resistor 352 as shown in FIG. 31.

Figure 32:
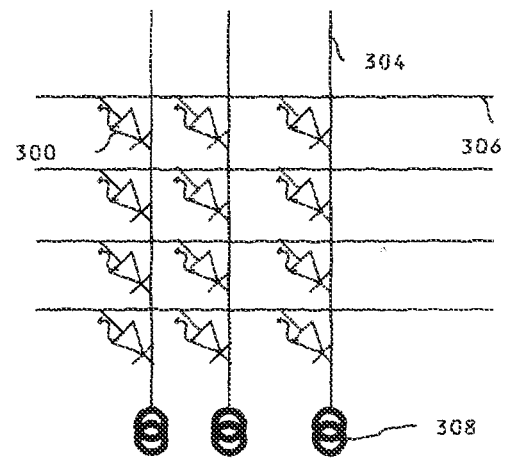
FIG. 32 shows a further connection apparatus for an array of LEDs.

Some or the entire LED array may be connected as a cross point matrix FIG. 32, In this case the same electrode (say the anode) of all LED devices 300 in a row e.g. 306 are connected together; and the other LED electrodes (cathodes) in a column e.g. 304 are all connected together. When all devices are connected to their respective rows and columns, this produces a light source like a matrix display, which can be addressed one row at a time. For an n×m array only in fast, high power current sources 308 are needed as typically each device is illuminated for 1/n of the time. With suitable control this system can be arranged to function as a display or as a signalling device as well as provide illumination. The signalling function may be performed at such a speed and/or wavelength as to be unnoticeable to humans. The plurality of light emitting elements can thus be connected in an addressable array.

Figure 33:
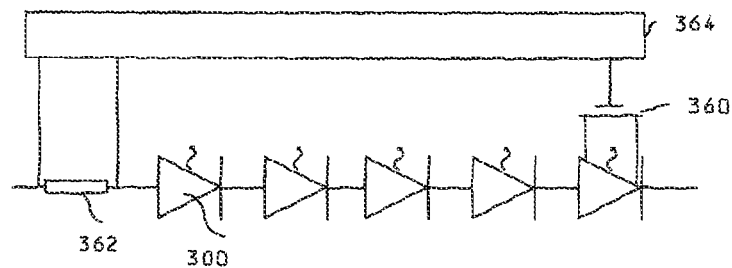
FIG. 33 shows a further connection apparatus for an array of LEDs.

FIG. 33 shows that a transistor 360 can be used to short circuit the voltage across a LED 300 so that ordinarily it does not operate. If greater light output is needed, for example if another element has failed, then the transistor may be switched to high resistance and LED 300 is now free to operate. The failure of a device may be detected by means of sense resistor 362 and circuitry block 364. Different strings or parts of the array may be turned on or off in order to facilitate dimming and or lumen maintenance. Different colour LEDs may be turned on or off to facilitate a change in colour temperature or a change in colour temperature when dimming the light.

Figure 34A:
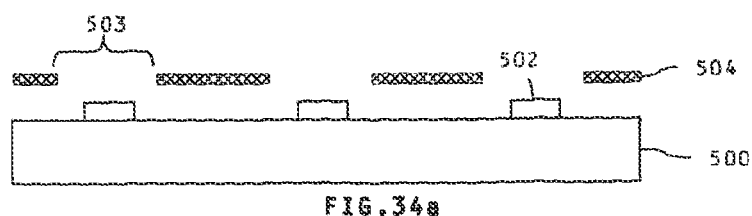
FIGS. 34a-34d show a method to form an array of electrode connections.

FIG. 34a shows a further embodiment for providing an array of electrode connections. Substrate 500 may comprise the array of optical elements such as item 41 in FIG. 9 or may be a plane substrate such as a glass, silicon, metal or ceramic substrate which may further comprise additional elements such as electrodes and heat spreaders. An array of light emitting elements 502 is formed on the substrate 500 and in a first step, a shadow mask 504 is provided in alignment with the array of light emitting elements 502. The mask 504 comprises an array of apertures 503 with size that is greater than the size of the electrode region to be provided on the upper surface of the light emitting elements 502. The mask may comprise for example a high melting point metal or a polymer material such as polyimide.

Figure 34B:
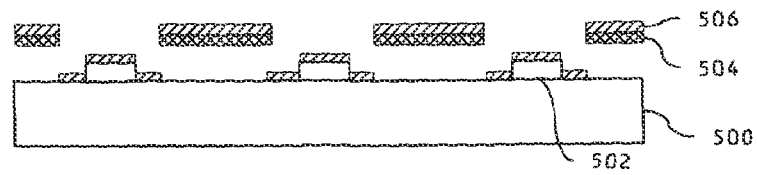
Figure 34C:
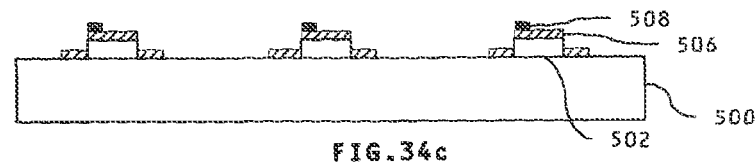
Figure 34D:

In a second step as shown in FIG. 34b, a coating 506 is formed on the surface of the light emitting elements 502 and mask 504. The coating 506 may comprise metal or dielectric materials suitable for providing electrical connection to the upper surface of the light emitting elements 502 and insulation from surrounding electrical features. The coating may comprise a stack of materials of required thickness including but not limited to titanium, palladium, aluminium, gold, silver, indium, nickel and alloys thereof. The coating 506 may be formed by evaporation, sputtering, chemical vapour deposition or other known methods. Advantageously, after forming the coating 506, the material of one or more of the coatings 506 deposited on mask 504 may be recycled. Typically the light emitting elements 502 of the present embodiments comprise relatively small devices, for example 100 micrometers width with spacing of for example 1 mm or more. Such an arrangement means that the area coverage of the light emitting elements may be less than about 1% of the total area on which the coating is formed. In this manner, the coating materials 506 may be recycled to reduce cost.

After the deposition step of FIG. 34b, the thickness of the coating deposited through the shadow mask may be subsequently increased by an electro-deposition or plating process using the regions deposited through the mask as seed layers.

In a third step a lithographically patterned array of photoresist 508 may be formed on the surface of the coating 506 and light emitting elements 502 as is well known in the art. In a fourth step, etching is used to selectively remove part of the coating 506 so as to provide a small electrode region 507. In this manner, the high precision and small size of photolithographic electrodes can be combined with the recycling capability of the lower precision shadow mask technology. Advantageously small electrodes that provide high light output can be provided at low cost. Further, the light emitting elements operate in a VTF configuration enabling higher current density with high efficiency.

Figure 35A:
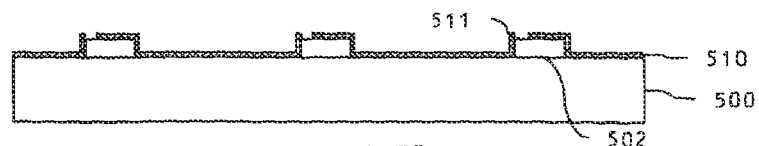
FIGS. 35a-35c show a further method to form an array of electrode connections.
Figure 35B:
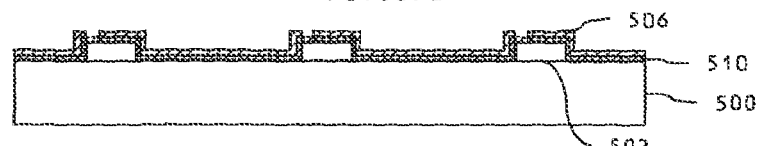
Figure 35C:
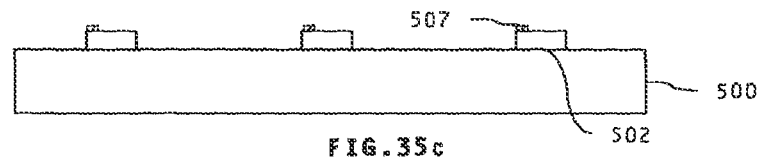

FIGS. 35a-c show an alternative method for forming an array of electrodes comprising a 'lift-off' step. In a first step as shown in FIG. 35a, a patterned photoresist layer 510 comprising aperture regions 511 is formed on the surface of the substrate 500 and light emitting elements 502. As shown in FIG. 35b, a coating 506 such as a stack of metal layers is formed on the photoresist for example by evaporation or sputtering. In a third step as shown in FIG. 35c a known photoresist lift off technique is provided to remove the coating outside the desired electrode region 507. The metal of coating 506 can be recovered from the lifted off material and advantageously recycled.

Figure 35D:
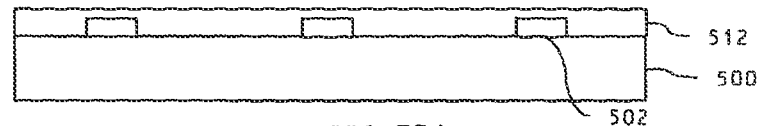
FIGS. 35d-f show a further method to form an array of electrode connections.
Figure 35E:
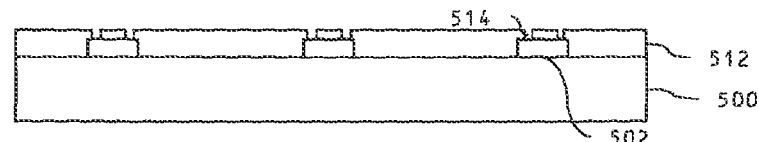
Figure 35F:
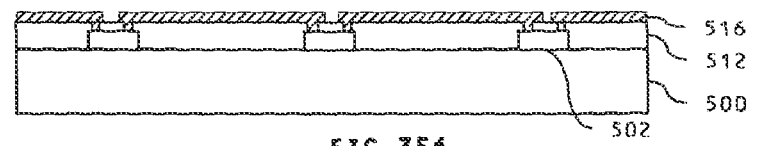
Figure 35G:
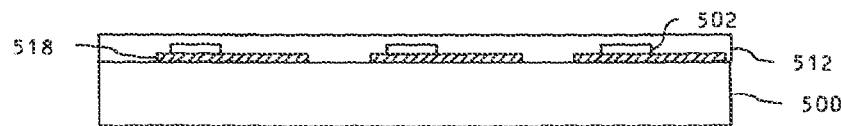
FIGS. 35g-i show a further method to form an array of electrode connections.
Figure 35H:
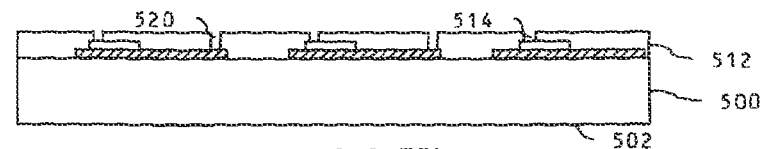
Figure 35I:
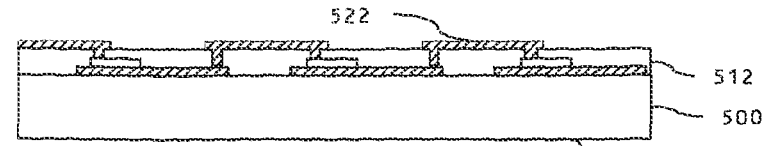

FIGS. 35d-f show an alternative method for forming an array of electrodes. In a first step as shown in FIG. 35d, a substantially uniform layer 512 is provided on the surface of the substrate 500 and light emitting elements 502. The layer 512 may comprise for example a polyimide layer. In a second step as shown in FIG. 35e apertures 514 are provided for example by means of photolithography or laser patterning. In a further step as shown in FIG. 35f, electrodes may be patterned on the surface, for example by means of an evaporator and shadowmask (not shown). FIG. 35g-i show a further method for forming an array of electrodes. In a first step as shown in FIG. 352, light emitting elements are arranged on an electrode array 518 and the layer 512, for example polyimide provided. As shown in FIG. 35h, via holes 520 are formed in the layer 512, for example by means of photolithography or laser patterning. As shown in FIG. 35i, electrodes are patterned on the upper surface of layer 512 to provide a VTF type electrode connection. The processes of FIGS. 35a-i may be applied to planar substrates or to optical element arrays to provide first and second electrode arrays.

Figure 36A:
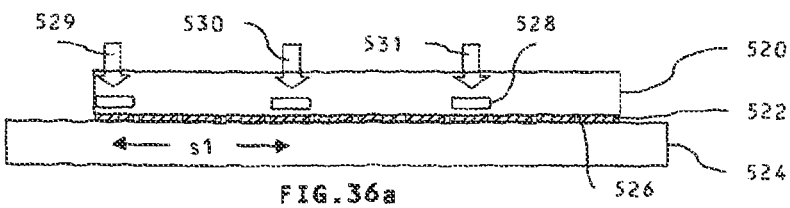
FIGS. 36a-36g show a method to form an array of light emitting elements.

FIGS. 36a-36d show a further method to provide an array of light emitting elements. In FIG. 36a, a semiconductor support substrate 520 is provided with an array 522 of light emitting elements formed on its surface separated by gaps 526 and arranged with a first adhesive substrate 524. For example the semiconductor support substrate 520 may be sapphire, the light emitting elements may be gallium nitride and the gaps 526 may be formed by laser scribing or other known scribing, etching or ablation techniques. Ultraviolet electromagnetic radiation beams 529, 530, 531 from a homogenised excimer laser are used to illuminate patterned regions 528 in alignment with some of the light emitting elements of the array 522. Light is transmitted through the substrate 520 and by illumination with a short pulse of light, decomposition of the semiconductor material close to the interface of the substrate 520 achieves a loss of adhesion of the light emitting element to the substrate 520. For example, gallium nitride illuminated with a 30 nanosecond pulse of energy approximately 1 J/cm2 disassociates the gallium nitride to provide gallium metal and nitrogen gas.

Figure 36B:
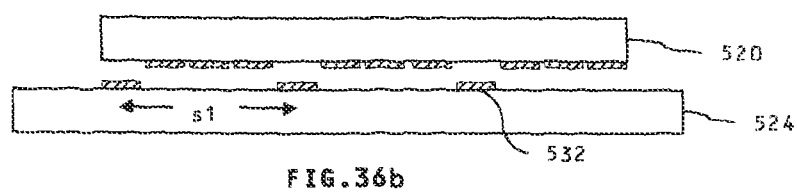

After exposure in a separation step as shown in FIG. 36b, the sandwich 520, 522, 524 may be heated above the melting point of gallium to achieve selective detachment of the light emitting elements of the array 522 from the substrate 520. On illumination of the respective light emitting elements of the array 522, transfer of an array of separated light emitting elements 532 to adhesive substrate 524 is thus achieved by means of laser lift off while the remaining light emitting elements of the array 522 remain attached to the substrate 520.

Figure 36C:
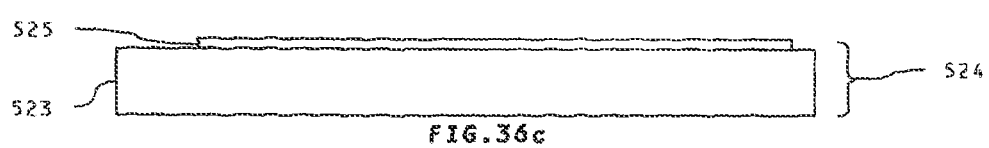

The array 522 may advantageously be in contact with an adhesive substrate 524 as shown in FIG. 36c. The adhesive substrate 524 may advantageously comprise a surface with weak adhesive properties capable of providing a temporary bond to the light emitting elements after the laser lift off step. A suitable material for the adhesive substrate may be a cross linked polydimethylsiloxane, PDMS that may be free standing or may be formed as a pre-cured adhesive layer 525 on a rigid or semi-rigid substrate 523. The support substrate may be rigid such as glass, or may be for example a flexible polymer sheet. Alternatively the PDMS may be cured in contact with the array 522 of light emitting elements with or without a backing substrate.

Figure 36D:
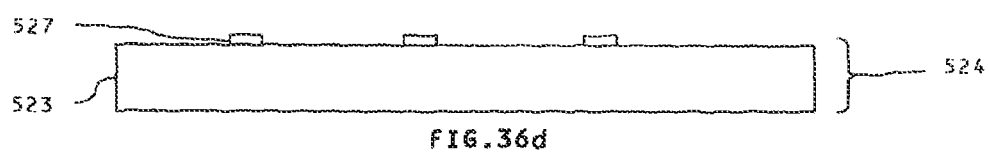
Figure 36E:
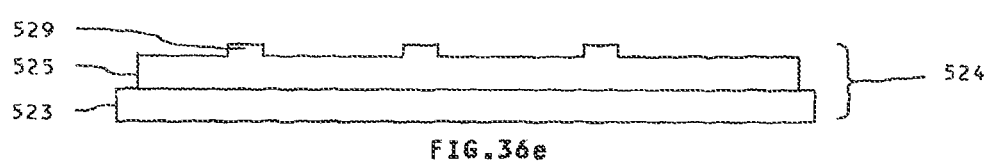

The substrate 524 may comprise other adhesive materials with weak adhesive properties such as waxes or pressure sensitive adhesives or layers 525 with a sparse distribution of adhesive regions on a scale smaller than the light emitting elements achieving a low adhesive force and low separation energy for subsequent substrate separation steps. As shown in FIG. 36d, an adhesive layer may comprise regions 527 of adhesive material 525 that may be aligned with the respective light emitting elements during the laser lift off step. Alternatively as shown in FIG. 36e, the layer 525 may comprise surface relief regions 529 of adhesive material. The embodiments of FIGS. 36d and 36e advantageously reduce the adhesion of the substrate 524 to the elements that are not removed in the laser lift off step, or the adhesion of the layer 525 to subsequent attachment substrates.

Advantageously, the adhesive force of the substrate 524 to the selectively removed light emitting elements may hold the selectively removed light emitting elements from the laser lift off step while releasing from light emitting elements on the semiconductor substrate 520 that were not exposed to laser illumination.

The adhesive material 525 may advantageously comprise a flexible layer arranged to conform with the surface of the semiconductor support substrate 520 and array 522 of light emitting elements. The substrate 520 and array 522 may be formed from materials with different thermal expansion coefficients, so that at room temperature the array 522 is warped. A rigid support substrate 523 may not be conveniently arranged in contact with all elements of the array 522, whereas a flexible support substrate 523 can conform to the surface. Alternatively gaps 526 may be arranged to relieve the stress in the layer 522 thus enabling a planar substrate 520 and a rigid substrate 523 to be provided.

The separation s1 of the light emitting elements from the semiconductor support substrate 520 is substantially the same as the separation on the adhesive substrate 524. The separation s1 may advantageously be substantially the same as the separation of the input apertures of the array of optical elements providing uniform illumination across large arrays of components, thus enabling mothersheet substrate processing. A mothersheet comprises a light emitting element support substrate of extended size, thus enabling many light emitting elements to be processed in parallel. Further the mothersheet area may be of sufficient size so that many illumination apparatuses can be processed in parallel. For example, an illumination apparatus may achieve a 1000 lm output, and the mothersheet may be of sufficient size to achieve parallel processing of ten or more such devices in parallel prior to a singulation step. Advantageously such a mothersheet substrate processing approach can produce significant reduction in illumination apparatus cost.

Figure 36F:
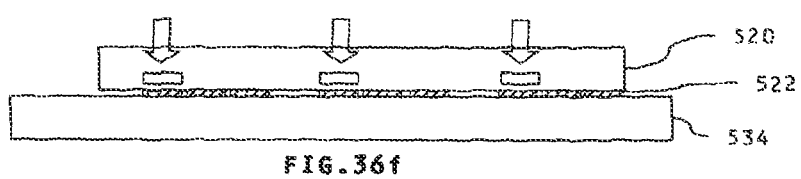
Figure 36G:
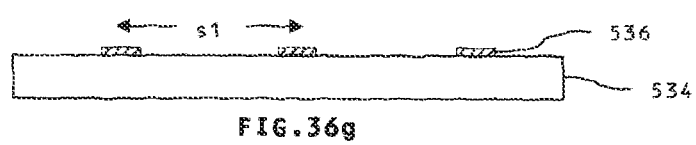

In a further step as shown in FIG. 36f, second regions of the array 522 are transferred from the semiconductor support substrate 520 onto a second adhesive substrate 534 to provide a second array 536 of separated light emitting elements with separation s1 as shown in FIG. 36g.

Figure 36H:
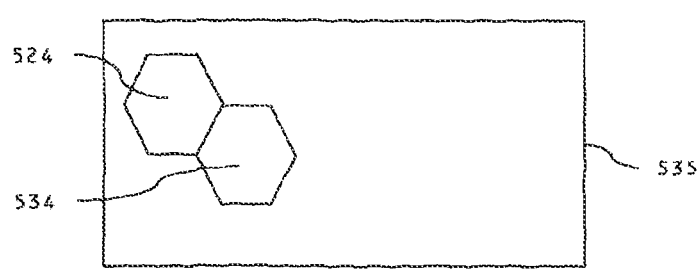
FIG. 36h shows a mothersheet support substrate comprising multiple arrays of light emitting elements.

As shown in FIG. 36h in plan view, multiple substrates including 524 and 534 may be aligned onto a mothersheet support substrate 535 to produce an extended array of light emitting elements from which many illumination elements may be formed. Substrate 535 may comprise for example an optical element array structure 41 (in FIG. 9) comprising optical elements 1 or may be a plane substrate such as a glass or ceramic substrate which may further comprise additional elements such as heat spreaders and electrodes. Advantageously such an arrangement achieves the alignment of multiple arrays on a single substrate. The adhesive substrate 524 may comprise a flexible substrate that can bend in conformity with both a semiconductor support substrate 520 and substrate 535. Advantageously, such an arrangement achieves arrays of light emitting elements to be extracted from warped wafers 520 and applied to flat substrates 535. Advantageously the arrays of light emitting elements 532, 536 may be aligned with lithographic precision so that the composite arrays on the substrate 535 achieve high precision of alignment with the respective optical elements.

Figure 36I:
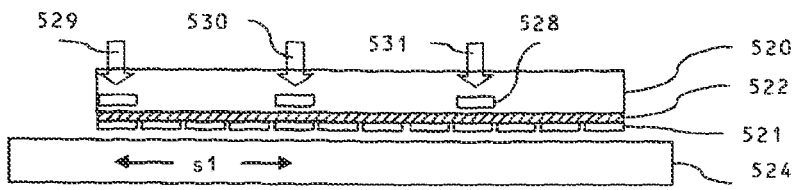
FIGS. 36i-36j show a further method to form an array of light emitting elements.
Figure 36J:
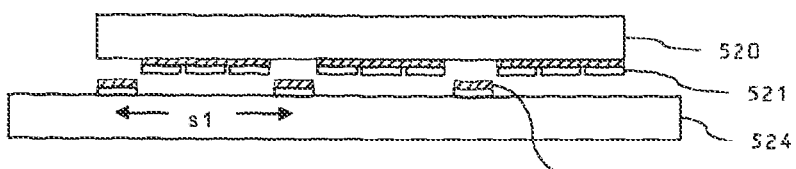

The gaps 526 of FIG. 36a may be provided by means of laser scribing, etching partial sawing or other know separation techniques. Alternatively, as shown in FIG. 36i, the array 522 of light emitting elements may be provided with no pre prepared gaps, and is provided in layers (for example n doped and p doped layers). An optional support layer 521 which may be patterned may be formed on the array 522. The ultraviolet electromagnetic radiation beam illumination 529, 530, 531 may be arranged so as to provide separation of the elements defined by the size of the beam providing sparse array separation as shown in FIG. 36j. The step in which the gap 526 (as shown in FIG. 36a) is formed is eliminated and advantageously cost is reduced. On laser exposure of the layer 522, defects such as cracks in the emitting layer may propagate, damaging the removed light emitting elements.

Thus a method of manufacturing an illumination apparatus may comprise the steps of: forming a monolithic array of light-emitting elements on a support substrate in a continuous layer; selectively removing a plurality of light-emitting elements from the monolithic array in a manner that preserves the relative spatial position of the selectively removed light-emitting elements; wherein the monolithic array of light-emitting elements are illuminated by a plurality of shaped laser beams; wherein the plurality of light-emitting elements that are selectively removed from the monolithic array are selected such that, in at least one direction, for at least one pair of the selectively removed light-emitting elements in the at least one direction, for each respective pair there is at least one respective light-emitting element that is not selected that was positioned in the monolithic array between the pair of selectively removed light-emitting elements in the at least one direction. A patterned support layer may be formed on the plurality of light emitting elements.

Thus a method of manufacturing an illumination apparatus may comprise: forming a monolithic array 522 of light-emitting elements made of a plurality of layers on a substrate 520, the light emitting elements 532 being interconnected in the layers they are formed in; selectively illuminating a plurality of the light emitting elements 532 with an illumination 529, 530, 531 that separates, at least to an extent, the selected light emitting elements 532 from the substrate 520; the illumination 529, 530, 531 further breaking the connection in the layers between each selectively illuminated light emitting element 532 and the other light emitting elements; removing the illuminated light-emitting elements 532 from the monolithic array in a manner that preserves the relative spatial position of the removed light-emitting elements 532; wherein the plurality of light-emitting elements 532 that are selectively illuminated and removed from the monolithic array are selected such that, in at least one direction, for at least one pair of the selectively illuminated and removed light-emitting elements in the at least one direction, for each respective pair there is at least one respective light-emitting element that is not selected that was positioned in the monolithic array between the pair of selectively illuminated and removed light-emitting elements 532 in the at least one direction. Further a patterned support layer 521 may be formed on the plurality of light emitting elements 532.

Advantageously, patterned or unpatterned support means 521 can be provided on the surface of the array 522 to reduce damage during the laser processing step and to provide uniform size of extracted material from the array 522. The layer 521 may be a metal layer and may form part of the electrode structure of the device or may be some other layer such as a polymer stabilisation layer that may be removed in subsequent processing steps. The edges of the light emitting elements may be cleaned, for example by means of a laser writing or selective etch step.

Figure 37A:
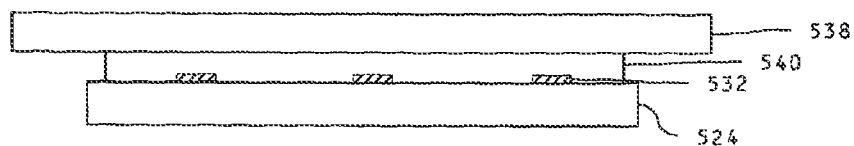
FIGS. 37a-37d show a further method to form an array of light emitting elements.
Figure 37B:
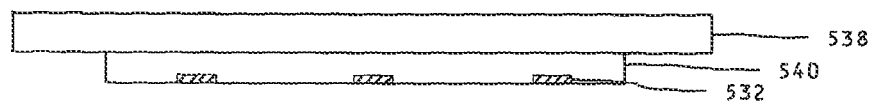
Figure 37C:
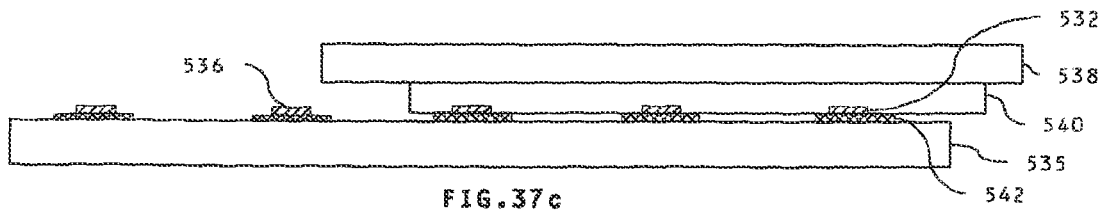
Figure 37D:
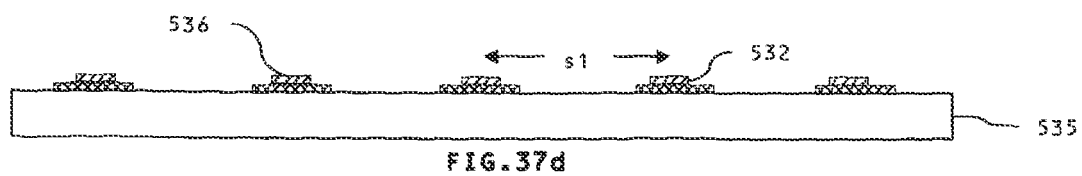

Gallium nitride LEDs are typically grown with the n-doped side in contact with the wafer (n-down) with the p-doped side uppermost (p-up). The embodiment of FIG. 36h provides n-down LEDs on the substrate 535 wherein the n doped side is in contact with the substrate. Such an arrangement requires a transparent current spreading electrode to be formed on the p doped side of the chip which reduces the optical output of the chip. It is advantageous to provide arrangements wherein the p doped side of the chip is coated with a highly reflective conductive electrode and is positioned in contact with the substrate (p-down). The higher conductivity of the n doped side of the LED means that a transparent current spreading electrode is not necessary and thus increases optical output. FIGS. 37a-37d show one method to achieve a p-down arrangement. After the step of extraction of the array 532 onto the receiver substrate 524 as shown in FIG. 36b, a material 540 is applied to the surface of the substrate 524 and array 532 as shown in FIG. 37a. The material 540 may for example be a photoresist or polyimide material. A further substrate 538 may be provided to support the material 540. After processing of the material 540, for example by means of heat or by UV illumination, the receiver substrate 524 is removed as shown in FIG. 37b, achieving embedding of the array 532 in the material 540 with the p-doped surfaces exposed. Advantageously, the adhesive force between the adhesive material 525 of the adhesive substrate 524 to the light emitting element array 532 is lower than the adhesive force between the material 540 to the array 532. The array 532 is then brought into contact with the substrate 535 which may comprise heat spreading, electrode and light reflecting elements 542 as shown in FIG. 37c. Advantageously, the light emitting elements 532 are incorporated into a material 540 capable of withstanding process temperature required for formation of solder joint to the heat spreader and electrode elements 542. After soldering the material 540 and substrate 538 is removed for example by immersion in a suitable solvent or by peeling at an elevated temperature as shown in FIG. 37d.

Similarly a further light emitting element array 536 may be transferred to a separate region of the substrate 535. Such a process advantageously preserves the separation of the light emitting elements of the respective arrays while providing p-doped side of the light emitting elements in contact with the substrate electrodes.

Thus a method of manufacturing an illumination apparatus comprises the steps of forming a monolithic array 522 of light-emitting elements; selectively removing a plurality of light-emitting elements from the monolithic array 522 to a first adhesive substrate 524 in a manner that preserves the relative spatial position of the selectively removed light-emitting elements; transferring the plurality of light emitting elements from the first adhesive substrate 524 to a second adhesive substrate 538, 540 in a manner that preserves the relative spatial position of the selectively removed light-emitting elements wherein the adhesive force of light emitting elements to the second adhesive substrate 538, 540 is greater than the adhesive force of the light emitting elements to the first adhesive substrate 524; transferring the plurality of light emitting elements from the second adhesive substrate 538, 540 to a substrate 535 in a manner that preserves the relative spatial position of the selectively removed light-emitting elements wherein the adhesive force of the light emitting elements to the substrate 535 is greater than the adhesive force of the light emitting elements to the second adhesive substrate 538, 540; wherein the plurality of light-emitting elements that are selectively removed from the monolithic array 522 are selected such that, in at least one direction, for at least one pair of the selectively removed light-emitting elements in the at least one direction, for each respective pair there is at least one respective light-emitting element that is not selected that was positioned in the monolithic array between the pair of selectively removed light-emitting elements in the at least one direction.

Thus a method of manufacturing an illumination apparatus; comprises: forming a monolithic array 522 of light-emitting elements; selectively removing a plurality of light-emitting elements 532 from the monolithic array 522 by adhering them to a first adhesive substrate 524 in a manner that preserves the relative spatial position of the selectively removed light-emitting elements 532; transferring the plurality of light emitting elements from the first adhesive substrate 524 to a second adhesive substrate 538, 540 in a manner that preserves the relative spatial position of the selectively removed light-emitting elements 532; transferring the plurality of light emitting elements 532 from the second adhesive substrate 538, 540 to a support substrate 535 in a manner that preserves the relative spatial position of the selectively removed light-emitting elements 532; wherein the plurality of light-emitting elements 532 that are selectively removed from the monolithic array are selected such that, in at least one direction, for at least one pair of the selectively removed light-emitting elements 532 in the at least one direction, for each respective pair there is at least one respective light-emitting element that is not selected that was positioned in the monolithic array between the pair of selectively removed light-emitting elements in the at least one direction. The adhesive force of light emitting elements 532 to the second adhesive substrate 538, 540 may be greater than the adhesive force of the light emitting elements 532 to the first adhesive substrate 524. The adhesive force of the light emitting elements 532 to the support substrate 535 is greater than the adhesive force of the light emitting elements 532 to the second adhesive substrate 538, 540. The support substrate may comprise an array of optical elements 1 and the array of light emitting elements 532 is aligned with the respective optical elements 1. The support substrate 535 may comprises a planar substrate wherein the array of light emitting elements 532 is aligned with an optical element array structure 41 comprising an array of optical elements 1.

Figure 38A:
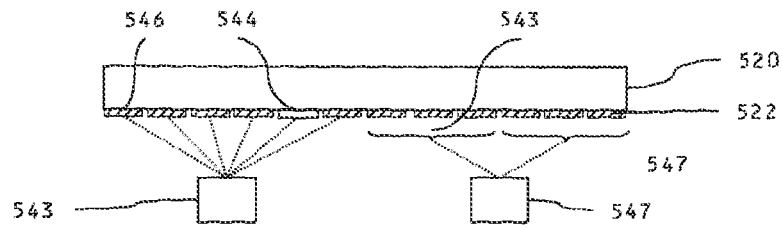
FIGS. 38a-38g show a further method to form an array of light emitting elements with increased yield.

Errors due to scratches, pits, epitaxial errors and other effects may be present on the epitaxial wafer prior to extraction of individual light emitting elements. FIG. 38*a* shows an embodiment in which wafer defects are present in light emitting elements of a monolithic array 522 and are characterised. For example, an element sensor 543 is used to determine the location of individual 'passed' light emitting elements 546 that have characteristics below a threshold tolerance of a functional criterion and 'failed' light emitting elements above a threshold tolerance of a functional criterion. The element sensor 543 may provide for example a functional criterion that comprises a distribution of output wavelength across the array and the defects may be due to varying thicknesses of epitaxial layers that result in differences in output wavelength. Passed devices 546 may be for example those with deviation from the target wavelength of less than or equal to +/−2 nm while failed devices 544 may have a deviation from the target wavelength of greater than +/−2 nm. Alternatively the element sensor may measure a functional criterion comprising surface defect characteristics or may determine electrical characteristics of the light emitting elements. An area sensor 547 may provide measurements from groups 543 of light emitting elements, such that light emitting elements in groups 543 are classed as passed or failed light emitting elements. Pass distributions comprising the location of passed light emitting elements and fail distributions comprising the location of failed light emitting elements may thus be provided. Fail distributions will typically comprise those elements that are not in the pass distribution. It is desirable that the light emitting elements 544 in the fail distribution are not incorporated onto the substrate 500 as they may cause for example at least reduced brightness, incorrect colour, short circuit or open circuit.

Figure 38B:
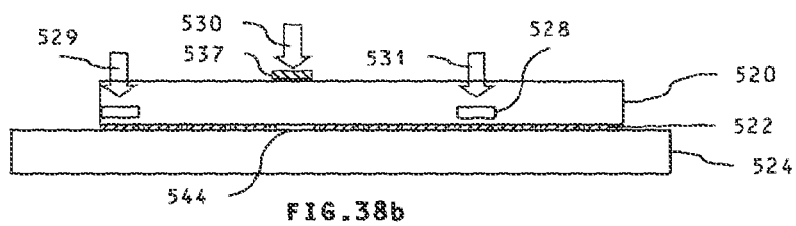
Figure 38C:
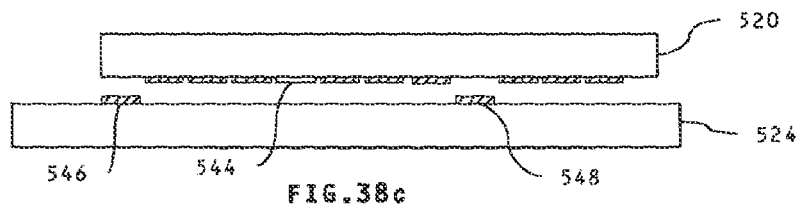
Figure 38D:
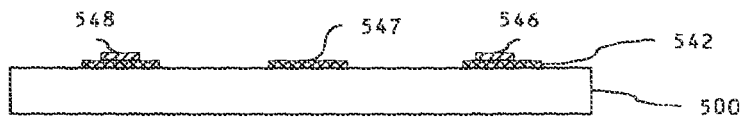

As shown in FIG. 38*b*, in the lift off step, the patterned UV illumination is modified so that beam 530 is absorbed, reflected or diffused by a feature 537 formed on the opposite side of the semiconductor support substrate 520 to the epitaxial layer comprising array 522 of light emitting elements. Feature 537 may for example comprise a deposited region of absorbing material in alignment with the element 544 that may be formed by an addressable printing method such as inkjet printing, a structured diffusing surface produced by laser processing or a patterned metal formed by a deposition method. On illumination, beam 530 is absorbed, diffused or reflected while beams 529, 531 are transmitted. If the power density at the surface of the element 544 with the semiconductor support substrate 520 falls below a threshold, then element 544 will not be lifted off and will remain attached to the semiconductor support substrate 520 as shown in FIG. 38*c* while the passed light emitting elements 546, 548 are transferred onto the substrate 500 and leaving an unfilled element 547 as shown in FIG. 38*d*.

Figure 38E:
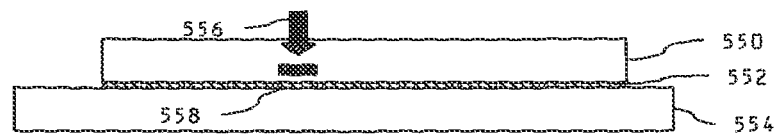
Figure 38F:
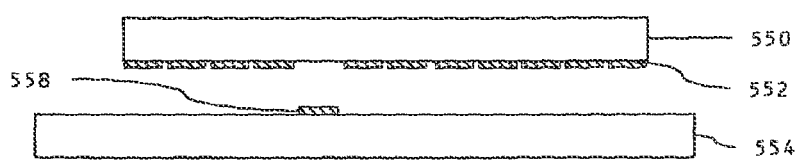
Figure 38G:
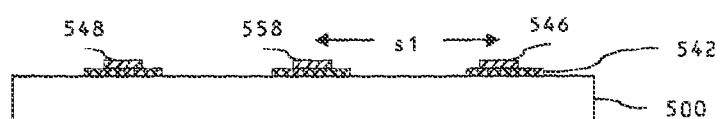

In further steps shown in FIGS. 38*e*-38*g*, regions of the substrate 500 with missing light emitting elements are filled by means of extraction of an array 558 of light emitting elements from another part of the wafer or indeed a second wafer 550 and array of light emitting elements 552. FIG. 38*e* shows the patterned laser lift off step and FIG. 38*f* shows the separated elements on the adhesive substrate 554. Adhesive substrate 554 is aligned with substrate 500 and array of elements 542 so as to provide an array of light emitting elements 546, 558 from respective first and second wafers on the substrate 500 as shown in FIG. 38*g*.

A method of manufacturing an illumination apparatus thus comprises: forming a first monolithic array 522 of light emitting elements; determining a first plurality of the light emitting elements 546, 548 which pass a functional criterion; determining a second plurality of the light emitting elements 544 which fail the functional criterion; selectively removing a plurality of the passed light emitting elements 546, 548 whose relative positions in the first monolithic array 522 correspond to desired relative positions in a desired non-monolithic array of light emitting elements, the selectively removing being performed in a manner that preserves the relative spatial position of the selectively removed passed light-emitting elements 546, 548; wherein the plurality of passed light-emitting elements 546, 548 that are selectively removed from the monolithic array 522 are selected such that, in at least one direction, for at least one pair of the selectively removed passed light-emitting elements 546, 548 in the at least one direction, for each respective pair there is at least one respective light-emitting element that is not selected that was positioned in the monolithic array between the pair of removed passed light-emitting elements in the at least one direction; and forming a non monolithic array of light-emitting elements with the selectively removed passed light-emitting elements 546, 548 in a manner that preserves the relative spatial position of the selectively removed passed light-emitting elements; by virtue of which in the formed non-monolithic array of light emitting elements desired relative positions of the desired array that correspond to passed light emitting elements in the first monolithic array are occupied by passed light emitting elements 546, 548 and desired relative positions of the desired array that correspond to failed light emitting elements in the first monolithic array are left unoccupied. Further light emitting elements 558 may be added to the formed non-monolithic array of light emitting elements in unoccupied desired relative positions of the desired array. The further light emitting elements 558 may be from a second monolithic array 552 of light-emitting elements that is different to the first monolithic array 522 of light-emitting elements. The further light emitting elements 558 may be from the first monolithic array of light-emitting elements. The further light emitting elements 558 may be light emitting elements which have been determined as passing the functional criterion. A light intensity reduction region 537 may be formed on a surface of the monolithic array support substrate 520 aligned with the second plurality of light emitting elements 544.

Advantageously, elements with known poor performance are not present in the transferred array, improving the yield and achieving a reduced requirement for testing of the final light emitting element array on the substrate. Such a method can therefore reduce the cost and improve the performance of the substrate array. In some applications, particularly those requiring observers to look directly at the light engine, it may be desirable that all of the light emitting elements are functional to avoid dead spots in the output illumination. In this embodiment, further processing steps may be undertaken to prevent defects in the array 552 being transferred to substrate 500 using further wafers.

Alternatively as the final devices on the substrate 535 contain light emitters from a wide area of wafer, depending on the yield statistics it may be advantageous not to fully test the wafer and to transfer some defective or even all devices. The averaging effect across the mother sheet means this may achieve satisfactory performance. Alternatively only emitters identified open circuit (non emitting) may be held back from transfer.

Thus a method of manufacturing an illumination apparatus may comprise the steps of forming a first monolithic array 522 of light-emitting elements; characterising the first monolithic array of light emitting elements to provide a pass distribution and a fail distribution of light emitting elements; selectively removing a plurality of passed light-emitting elements 546 from the first monolithic array 522 in a manner that preserves the relative spatial position of the selectively removed passed light-emitting elements 546; forming a non-monolithic array of light-emitting elements with the selectively removed passed light-emitting elements 546 in a manner that preserves the relative spatial position of the selectively removed passed light-emitting elements; wherein the plurality of passed light-emitting elements that are selectively removed from the first monolithic array 522 are selected such that, in at least one direction, for at least one pair of the selectively removed passed light-emitting elements in the at least one direction, for each respective pair there is at least one respective light-emitting element that is not selected that was positioned in the first monolithic array between the pair of passed selectively removed light-emitting elements in the at least one direction; selectively removing a second plurality of light-emitting elements 558 from a monolithic array 552 of light emitting elements wherein the second plurality of light-emitting elements 558 are arranged with at least part of the fail distribution in a manner that preserves the relative spatial position of the selectively removed second plurality of light-emitting elements 558; interspersing the second plurality of light-emitting elements 558 with the first plurality of passed light-emitting elements 546 to provide a corrected non-monolithic array of light emitting elements; and aligning the corrected non-monolithic array of light-emitting elements with an array of optical elements.

The method may further comprise the steps of forming a light intensity reduction region 537 on a surface of the monolithic array support substrate 520 aligned with the respective fail distribution of light emitting elements.

Figure 39A:
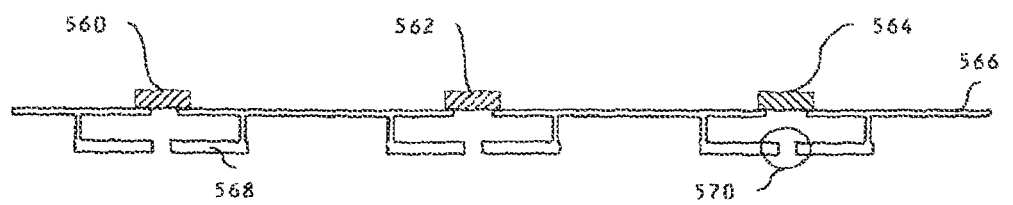
FIG. 39a shows schematically a string of LEDs comprising correction of light emitting element fault.
Figure 39B:
FIG. 39b shows schematically a further string of LEDs comprising correction of light emitting element fault.

As shown schematically in FIG. 39*a*, open circuit errors may occur for example due to attachment errors between the light emitting elements 560, 562, 564 and electrode arrangement 566. Additional circuitry 568 can be incorporated in the region of the light emitting elements so that in the case of a diagnosed error, a conductive material can be applied in the region 570. For example, testing may demonstrate that elements 560 and 562 are operating correctly whereas element 564 is open circuit. In this embodiment, a solder patch is applied to the region 570 to short circuit the region of the light emitting element. This embodiment achieves a greater reliability for light emitting elements connected in a series string. As shown in FIG. 39*b* a similar defect correction can be achieved by applying a conductive layer (e.g. solder) 562 directly over the light emitting element 564.

Figure 40:
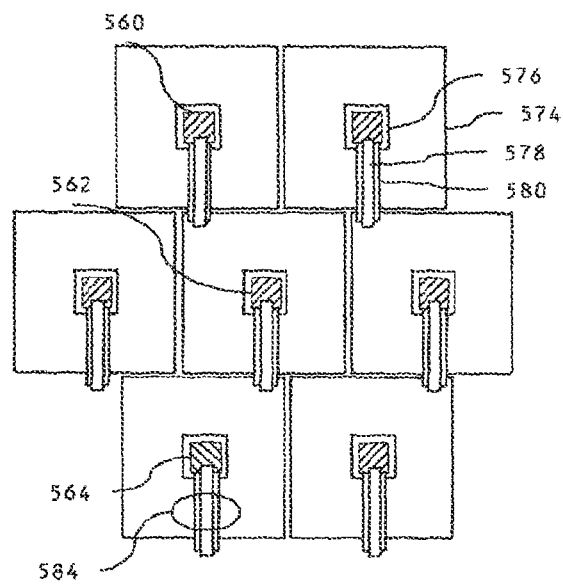
FIG. 40 shows in plan view an array of light emitting elements.

FIG. 40 shows in plan view a string of light emitting elements 560, 562, 564 connected by means of metallic heat spreaders 574, p-electrode solder region 576, n-electrode 578 and insulator 580, if element 564 is diagnosed as faulty, a conductive material can be applied in the region 584 to provide a short circuit so that the electrical string can advantageously continue to operate for elements 560 and 562.

Figure 41:
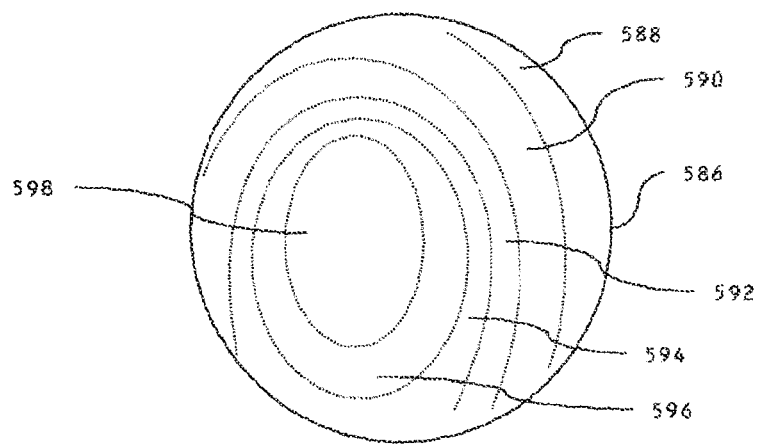
FIG. 41 shows a wafer comprising an array of light emitting elements.

FIG. 41 shows in plan view an epitaxial wafer 586 used to form an array of light emitting elements. Epitaxial growth non uniformities provide a variation of emission wavelength and forward voltage characteristics for elements across the surface of the wafer. Light emitting elements can thus be binned (i.e. placed into groups with similar properties) based on the region 588, 590, 592, 594, 596, 598 from which they originate on the wafer. The extraction process of for example FIGS. 36*a-h* may be used to extract a sparse array of light emitting elements from across the entire surface of the wafer 586. The extracted light emitting elements are arranged as a sparse array extracted from the wafer rather than from adjacent positions on the epitaxial layer on the wafer. For example, the light emitting elements may have size of 100×100 micrometres on a pitch of 2×2 millimetres. Light emitting elements are thus extracted from substantially all of the regions 588, 590, 592, 594, 596, 598 in each extraction step.

Figure 42A:
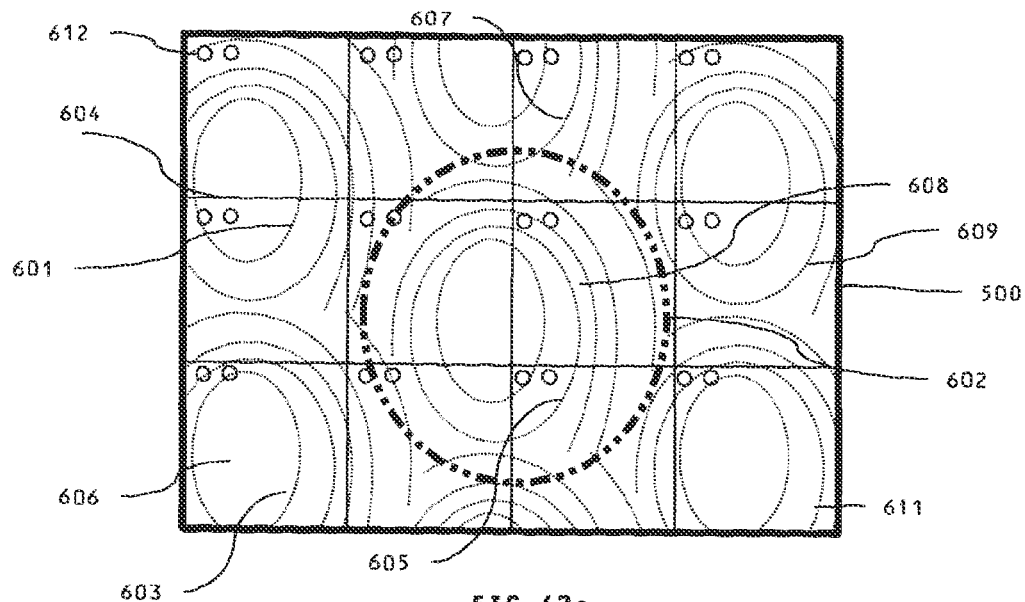
FIG. 42a shows a composite substrate comprising multiple arrays of light emitting elements.

The sparse array may then be assembled in alignment with other sparse arrays onto a support substrate 500 (which may be a large area mothersheet) as shown in plan view in FIG. 42*a*. Thus sparse arrays 601, 603, 605, 607, 609, 611 are arranged together on substrate 500. The properties of the respective sparse arrays vary spatially across the wafer 586 and the spatial variation of properties are thus transferred to the support substrate 500. The orientation of sparse arrays 601, 603, 605, 607, 609, 611 is shown in FIG. 42*a* as being the same. The orientation of the extracted sparse arrays 601, 603, 605, 607, 609, 611 may alternatively be varied to advantageously provide a mixture of bin regions and so properties within any single illumination element.

Figure 42B:
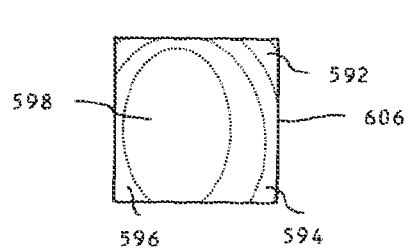
FIGS. 42b and 42c show regions of the composite substrate.
Figure 42C:
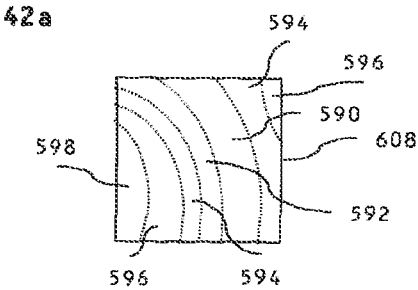

After a singulation step, individual illumination element regions 606, 608 (those that are used for example in a light engine for a single lighting fixture) are extracted from the substrate after cutting along lines 604, providing singulated illumination element regions 606, 608 as shown in FIG. 42*b* and FIG. 42*c* respectively. The singulation may be before or after alignment with optical elements and wavelength conversion layers described below.

Respective illumination element regions 606, 608 may comprise different portions of each of the respective bin regions 588, 590, 592, 594, 596, 598. Alternatively, the illumination element regions 606, 608 may comprise mixtures of regions from different wafers, for example achieved by arranging sparse arrays from different wafers on the substrate 500.

The integrated emission wavelength is an average of the emission from each of the elements within the respective illumination element regions 606, 608. The integrated emission wavelength advantageously comprises light from light emitting elements arranged in multiple bins and is thus an average value between the extremes of emission wavelength for individual light emitting elements. The difference in integrated emission wavelength for illumination element regions 606, 608 will typically be smaller than the total deviation of wavelength within a single wafer, reducing light engine bin size and illumination element cost.

By way of comparison, with standard pick-and-place extraction techniques, individual light emitting elements with size for example 1×1 millimetre are extracted from single regions of the water and thus have the properties of the single region. Such light emitting elements thus do not have the property averaging advantages of the present embodiments. Advantageously, reduced bin size achieves a reduced variation of illumination element properties, requiring less testing and higher control of properties, thus reducing cost and improving performance.

Figure 43:
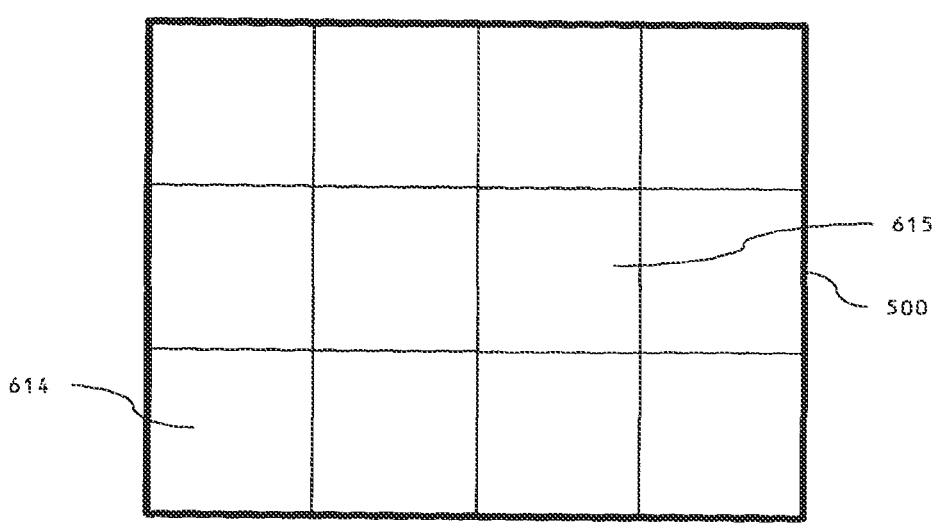

Gallium nitride LEDs typically produce a blue output that is converted to white light by means of a wavelength conversion material such as a phosphor. It would be desirable to further reduce the number of bins by tuning the wavelength conversion material to match the average emission wavelength of the respective illumination element regions 606, 608. As shown in FIG. 43, after preparation of the substrate 500 as shown in FIG. 42a, the substrate 500 may further comprise at least two different phosphor coating regions 614, 615 tuned to the average emission of the respective illumination element regions 606, 608 respectively. Thus each of the white light illumination elements fabricated from blue illumination element regions 606, 608 and respective aligned wavelength conversion regions 614, 615 may have a small bin range. Advantageously, the emission wavelength, voltage and other properties of the light engine can be produced in small bins thus further reducing cost.

Figure 44:
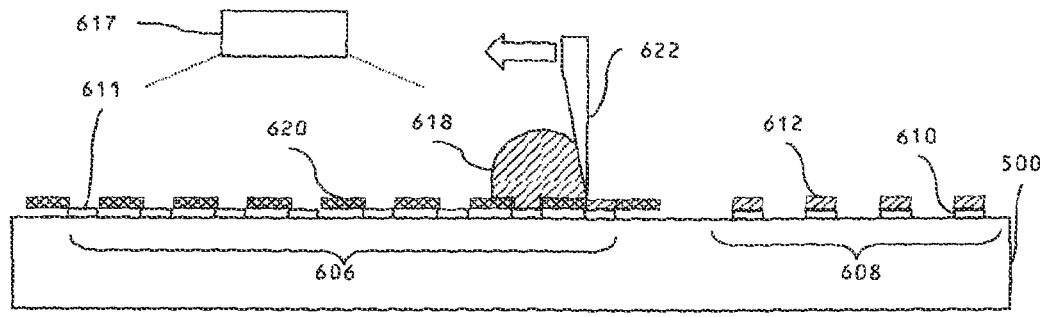
FIG. 44 shows a method to form a phosphor array.

The respective phosphor for the illumination element regions 606, 608 may be provided after dicing of the substrate 500 and singulation of the illumination element regions 606, 608. Alternatively FIG. 44 shows an embodiment wherein a patterned phosphor layer is applied across the substrate 500 prior to dicing and singulation, in illumination element region 608, a phosphor coating layer 612 is applied to light emitting elements 610 after measurement of the combined spectral output across the illumination element region 606. A sensor 617, such as a colorimeter or spectrophotometer is arranged to integrate the light from across the respective illumination element region and measure the combined spectral output of at least some of the light emitting elements 611. The expected region average white point may be determined by measuring the blue light output from the light emitting elements 610 and determining the white point that would be provided by a standard phosphor. This can then be used to provide the properties of a suitable matched phosphor layer 618 spectral characteristic to achieve the desired target white point. In illumination element region 608, a second phosphor layer 612 is provided, with spectral characteristic tuned to the mean emission wavelength of the light emitting elements 610. The phosphor may printed by means of a screen or stencil 620 and doctor blade 622 across the respective region. Alternatively the phosphors may be selectively deposited by an inkjet process. In this manner, high precision printing of individual phosphor coatings tuned to each of the individual light emitting elements is avoided, thus decreasing cost for a small bin size and achieving higher performance.

Thus a method of manufacturing an illumination apparatus may comprise the steps of forming a non-monolithic array of light-emitting elements 611, 612 on a support substrate 500; measuring the spectral output of at least some of the light-emitting elements 611 in a first region 606 of the support substrate 500; providing a first wavelength conversion layer 618 in alignment with the respective light emitting elements 611 of the first region 606 arranged to provide a first region average white point; measuring the spectral output of at least some of the light-emitting elements 610 in a second region 608 of the support substrate 500; providing a second wavelength conversion layer 612 different to the first wavelength conversion layer 618 in alignment with the respective light emitting elements 610 of the second region 608 arranged to provide a second region average white point; wherein the first and second region average white points are the same.

Thus a method of manufacturing an illumination apparatus may comprise the steps of forming a non-monolithic array of light-emitting elements 611 on a support substrate 500; for at least some of the light-emitting elements 611 in a first region 606 of the support substrate 500, measuring their combined spectral output; providing a first wavelength conversion layer 618 in alignment with the respective light emitting elements 611 of the first region 606, the spectral characteristic of the first wavelength conversion layer 618 being selected dependent upon the measured combined spectral output from the measured light emitting elements 611 of the first region 606; for at least some of the light-emitting elements 612 in a second region 608 of the support substrate 500, measuring their combined spectral output; and providing a second wavelength conversion layer 612 in alignment with the respective light emitting elements 610 of the second region 608, the spectral characteristic of the second wavelength conversion layer 612 being selected dependent upon the measured combined spectral output from the measured light emitting elements 610 of the second region 608.

A first region average white point may be provided by virtue of providing the first wavelength conversion layer 618 in alignment with the respective light emitting elements 611 of the first region 606; a second region average white point may be provided by virtue of providing the second wavelength conversion layer 612 in alignment with the respective light emitting elements 610 of the second region 608, and wherein the first region average white point and the second region average white point are thereby more similar than they would be if the two regions 606, 608 had been provided with a same wavelength conversion layer. A first region average white point is provided by virtue of providing the first wavelength conversion layer 618 in alignment with the respective light emitting elements 611 of the first region 606, a second region average white point is provided by virtue of providing the second wavelength conversion layer 612 in alignment with the respective light emitting elements 610 of the second region 608, and wherein the first region average white point and the second region average white point are substantially the same. The spectral characteristics of the first wavelength conversion layer 618 may be different to the spectral characteristics of the second wavelength conversion layer 612, that is the spectrum that is output for a given light emitting element input is varied.

Alternatively or in combination, the white point can be adjusted by leaving some of the light emitting elements uncoated. Thus the number of light emitting elements 610, 611 that have a wavelength conversion layer can be used to adjust the white point of the respective regions 606, 608. Thus a method of manufacturing an illumination apparatus may comprise the steps of forming a non-monolithic array of light-emitting elements 611 on a support substrate 500; for at least some of the light-emitting elements 611 in a first region 606 of the support substrate 500, measuring their combined spectral output; providing a first wavelength conversion layer 618 in alignment with some of the respective light emitting elements 611 of the first region 606, wherein the number of light emitting elements 611 of the first region 606 that are provided with the first wavelength conversion layer 618 is adjusted dependent upon the measured combined spectral output from the measured light emitting elements 611 of the first region 606; for at least some of the light-emitting elements 610 in a second region 608 of the support substrate 500, measuring their combined spectral output; and providing a second wavelength conversion layer 612 in alignment with some of the respective light emitting elements 610 of the second region 608, wherein the number of light emitting elements 610 of the second region 608 that are provided with the second wavelength conversion layer 612 is adjusted dependent upon the measured combined spectral output from the measured light emitting elements 610 of the second region 608. The first and second wavelength conversion layers 612, 618 may be the same.

Alternatively or in combination, the white point can be adjusted by adjusting the thickness of the wavelength conversion layer. The thickness may be adjusted by varying the solvent fraction of the layers 612 and 618, or by adjusting the thickness of the stencil 620 to be different for different regions 606, 608. The thickness refers to the thickness of the layers 612, 618 after processing (for example after baking to remove solvent). Thus a method of manufacturing an illumination apparatus may comprise the steps of forming a non-monolithic array of light-emitting elements 611 on a support substrate 500; for at least some of the light-emitting elements 611 in a first region 606 of the support substrate 500, measuring their combined spectral output; providing a first wavelength conversion layer 618 in alignment with the respective light emitting elements 611 of the first region 606, the thickness the first wavelength conversion layer 618 being selected dependent upon the measured combined spectral output from the measured light emitting elements 611 of the first region 606; for at least some of the light-emitting elements 612 in a second region 608 of the support substrate 500, measuring their combined spectral output; and providing a second wavelength conversion layer 612 in alignment with the respective light emitting elements 610 of the second region 608, the thickness of the second wavelength conversion layer 612 being selected dependent upon the measured combined spectral output from the measured light emitting elements 610 of the second region 608.

Figure 45:
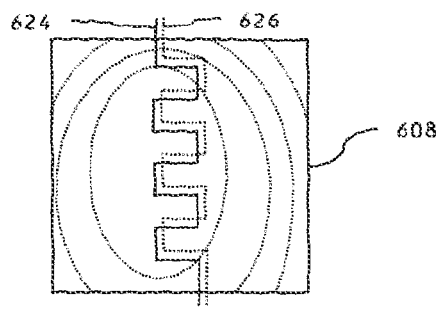
FIG. 45 shows a staggered electrode string.

FIG. 45 shows that the light emitting elements may be provided in strings wherein the string electrodes 624, 626 connected to light emitting elements 610 in region 608 cover a number of bin regions within the region. Thus the deviation about the mean of the total forward voltage across the string is reduced, advantageously simplifying some types of driver design and reducing cost.

Figure 46A:
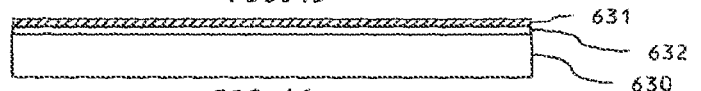
FIG. 46a-f shows a method to extract an array of light emitting elements formed on a light absorbing epitaxial substrate.

FIGS. 46*a-f* shows a method to form an array of light emitting elements for embodiments wherein the semiconductor epitaxial growth substrate 630 is not adequately transparent (in an electromagnetic wavelength band) to a suitable or desirable illumination wavelength for a lift off process such as a laser lift off process. Alternatively, the lift-off interaction layer may not be well suited to a desirable laser. For example, as shown in FIG. 46*a*, the semiconductor growth substrate 630 may be silicon or silicon carbide on which a light emitting element layer 632 is grown for example by known epitaxial growth methods. Such materials are typically substantially absorbing to the ultraviolet radiation wavelength band typically used in excimer laser lift off at GaN-sapphire interfaces. Alternatively the laser lift off process may not be sensitive to electromagnetic radiation of a desirable light source. For example the interface of GaN-sapphire is not sensitive to decomposition in infra-red electromagnetic radiation in comparison with that is achieved by excimer laser illumination. Infra-red electromagnetic radiation is a preferable electromagnetic radiation source due to its lower cost compared to excimer laser sources.

A metallisation layer 631 may be applied to the top surface of the layer 632 to provide electrical connection to the light emitting elements following an extraction step. The metallisation layer 631 may be continuous or may be patterned. Further the metallisation may be suitable for bonding to electrodes, for example by eutectic soldering to other layers on a substrate such as a support substrate which may be a mothersheet.

Figure 46B:
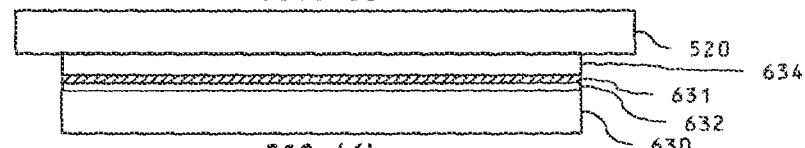

FIG. 46*b* shows that a support substrate 520 that is transparent in an electromagnetic radiation wavelength band may be attached to the layer 632 by means of an absorbing layer 634 that is absorbing in the electromagnetic wavelength band. The layer 634 may comprise for example an ultra-violet sensitive tape (wherein adhesion strength is lowered by means of an illuminating UV laser) or may an infra-red absorber (wherein adhesion strength is lowered by means of infra-red radiation). In each case, an array of patterned electromagnetic radiation beams 529, 530, 531 is used to illuminate the layer 634 in alignment with light emitting elements 532 that are desirably removed.

Figure 46C:
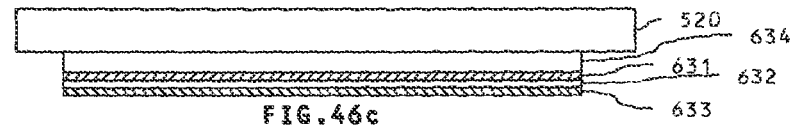

In a further step, layer 632 is removed from substrate 630 for example by means of an etch step, a photochemical etch or known lift off techniques to provide a structure of substrate and layers as shown in FIG. 46*c*. Further metallisation layers 633 may be applied to the opposite side of the light emitting element layer 632 compared to the metallisation layer 631.

Figure 46D:
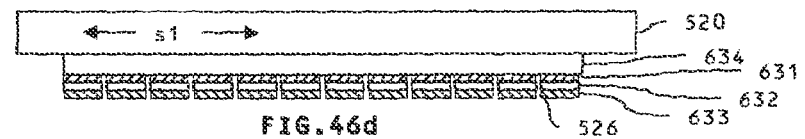

Further layers (not shown) such as silicon dioxide may be arranged between the layer 632 and substrate 630 to facilitate or improve the reliability of the separation, for example by means of wet etching or photochemical etching. The separated structure of FIG. 46*c* may then be patterned to provide an array of light emitting elements with separation s1, as shown in FIG. 46*d*, for example by means of laser scribing or etching.

Figure 46E:
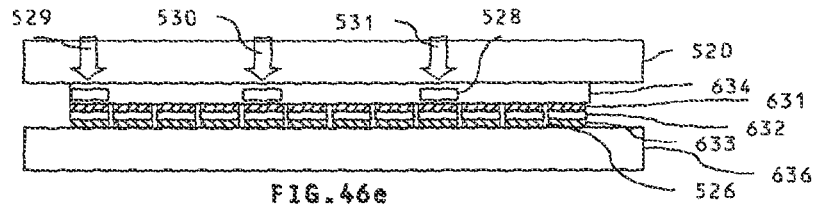
Figure 46F:
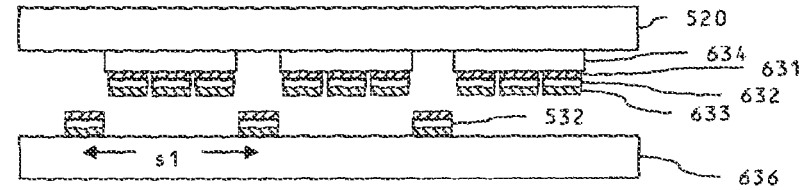

As shown in FIG. 46*e* in a similar manner to that used for FIG. 36*a*, a patterned array of optical illumination regions 528 in the electromagnetic radiation wavelength band is provided so as to provide a patterned lift off of light emitting elements with separation s1 onto support substrate 636 as shown in FIG. 46*f*. Residual material of layer 631 on elements 532 may be cleaned after the extraction step.

The substrate 636 may then be aligned with an array of optical elements, or may comprise the optical elements, for example as shown by optical element array structure 41 of FIG. 9; or may comprise an intermediate transfer substrate that is used to transfer the elements 532 onto a substrate 67 or optical element array structure 41.

Thus a method of manufacturing an illumination apparatus may comprise the steps of forming a monolithic light-emitting layer 632 on an electromagnetic radiation wavelength band absorbing substrate 630; transferring the monolithic light-emitting layer 632 to a electromagnetic radiation wavelength band transmitting substrate 520; selectively removing a plurality of light-emitting elements 522 from the monolithic light-emitting layer 632 in a manner that preserves the relative spatial position of the selectively removed light-emitting elements 522 by selectively illuminating the monolithic array of light-emitting elements 522 through the electromagnetic radiation wavelength band transmitting substrate 520 with electromagnetic radiation in the electromagnetic radiation wavelength band; forming a non-monolithic array of light-emitting elements 532 with the selectively removed light-emitting elements in a manner that preserves the relative spatial position of the selectively removed light-emitting elements; and aligning the non-monolithic array of light-emitting elements with an array of optical elements.

Thus method of manufacturing an illumination apparatus comprises forming a monolithic light-emitting layer 632 on a first substrate 630; transferring the monolithic light-emitting layer 632 to an electromagnetic wavelength band transmitting substrate 520; selectively removing a plurality of light-emitting elements 532 from the monolithic light-emitting layer 632 in a manner that preserves the relative spatial position of the selectively removed light-emitting elements 532, performing of the selectively removing comprising selectively illuminating the monolithic array of light-emitting elements through the electromagnetic wavelength band transmitting substrate 520 with light in the electromagnetic wavelength band; forming a non-monolithic array of light-emitting elements with the selectively removed light-emitting elements 532 in a manner that preserves the relative spatial position of the selectively removed light-emitting elements 532; and aligning the non-monolithic array of light-emitting elements 532 with an array of optical elements. The first substrate 630 may be an electromagnetic wavelength band absorbing substrate.

Advantageously, the absorption of the material or materials forming the layer 634 may be optimised for use with the wavelength band of the electromagnetic radiation source such as a laser used to provide illumination regions 528. For example, the laser may be an excimer laser with an ultraviolet wavelength band emission, for transmission through a substrate 520 comprising quartz or sapphire material. The material of the layer 634 may however have a wider process window than the gallium nitride to sapphire adhesion process window that may increase reliability and reduce process time. Alternatively an infra-red laser with an infra-red electromagnetic wavelength emission band may be used in combination with a substrate 520 comprising a glass or plastic substrate. Advantageously, infra-red electromagnetic radiation sources such as diode pumped solid state lasers may be provided with high power and low cost compared to excimer lasers. Thus, the throughput yield of the patterned laser lift off may be improved and the cost reduced. Further the beam uniformity requirements for illumination of layer 634 may be less tight than for UV excimer laser lift off, providing Gaussian beam exposure conditions and reduced probability of cracking of the layer 632 during the extraction step of FIG. 46e. Further, the substrate 630 may advantageously have reduced cost (for example silicon) compared to the sapphire epitaxial growth substrate of FIG. 36a reducing light emitting element cost. Further, the lattice constant of the epitaxial growth substrate 630 may be more closely matched to the lattice substrate of the semiconductor material of layer 632 (for example silicon carbide); thus reducing strain in the device and improving light emitting element performance.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the present disclosure as set forth in the appended claims and their legal equivalents.

The invention claimed is:

1. A method for manufacturing an illumination apparatus comprising:
    forming a first monolithic array of light-emitting elements;
    selectively removing a plurality of the light-emitting elements whose relative positions in the first monolithic array correspond to desired relative positions in a desired non-monolithic array of light-emitting elements, the selective removing being performed in a manner that preserves the relative spatial position of the selectively removed light-emitting elements, wherein the plurality of light-emitting elements that are selectively removed from the monolithic array are selected such that, in at least one direction, for at least one pair of the selectively removed light-emitting elements in the at least one direction, for each respective pair there is at least one respective light-emitting element that is not selected that was positioned in the monolithic array between the pair of removed light-emitting elements in the at least one direction;
    forming the desired non-monolithic array on a side of a substrate using the selectively removed light-emitting elements, in a manner that preserves the relative spatial position of the selectively removed light-emitting elements; and
    forming a plurality of electronic control components on the side of the substrate such that at least one of the plurality of electronic control components is positioned between a first pair of adjacent light-emitting elements of the non-monolithic array, and at least another one of the plurality of electronic control components is positioned between a different second pair of adjacent light-emitting elements of the non-monolithic array, wherein each of the plurality of electronic control components is for controlling at least one of the light-emitting elements of the non-monolithic array.

2. The method of claim 1, wherein the plurality of electronic control components comprises active and/or passive components.

3. The method of claim 2, wherein the plurality of electronic control components comprises transistors or integrated circuits, and each electronic control component is arranged to form an electrical circuit with the at least one light-emitting element that it is for controlling.

4. The method of claim 2, wherein the plurality of electronic control components comprises a resistive ballast layer.

5. The method of claim 1, wherein the plurality of electronic control components comprises a drive circuit for the light-emitting elements of the non-monolithic array, the drive circuit comprising at least one current source.

6. The method of claim 5, wherein the at least one current source is multiplexed to drive more than one light-emitting element of the non-monolithic array.

7. The method of claim 1, wherein the plurality of electronic control components comprises an infra-red or wireless RF receiver.

8. The method of claim 7, wherein the plurality of electronic control components are arranged to provide a signalling function at a speed and/or wavelength unnoticeable to humans.

9. The method of claim 1, wherein the monolithic array of light-emitting elements is made of a plurality of layers on a substrate, the light-emitting elements being inter-connected in the layers they are formed in, and
  the selective removal of the plurality of light-emitting elements comprises the steps of:
  selectively illuminating a plurality of the light-emitting elements with an illumination that separates, at least to an extent, the selected light-emitting elements from the substrate;
  removing the illuminated light-emitting elements from the monolithic array in a manner that preserves the relative spatial position of the removed light-emitting elements;
  wherein the plurality of light-emitting elements that are selectively illuminated and removed from the monolithic array are selected such that, in at least one direction, for at least one pair of the selectively illuminated and removed light-emitting elements in the at least one direction, for each respective pair there is at least one respective light-emitting element that is not selected that was positioned in the monolithic array between the pair of selectively illuminated and removed light-emitting elements in the at least one direction.

10. The method of claim 9, wherein the illumination further breaks the connection in the layers between each selectively illuminated light-emitting element and the other light-emitting elements.

11. The method of claim 9, wherein the connection in the layers between each selectively illuminated light-emitting element and the other light-emitting elements is broken at least in part by an etch step.

12. The method of claim 9, wherein the selective illumination comprises a plurality of shaped laser beams.

13. The method of claim 9, wherein the selective illumination comprises electromagnetic radiation in the ultraviolet wavelength band.

14. The method of claim 9, wherein the first substrate permits transmission therethrough of light in an electromagnetic wavelength band.

15. The method of claim 1, wherein the light-emitting elements have a maximum dimension of 0.1 mm or less.

16. The method of claim 1, wherein the illumination apparatus is for display illumination.

17. The method of claim 1, wherein the illumination apparatus is a display.

18. An illumination apparatus manufactured by the method of claim 1.

19. A display apparatus comprising the illumination apparatus of claim 18.

20. An environmental illumination apparatus comprising the illumination apparatus of claim 18.

* * * * *